(12) United States Patent
Suzuki et al.

(10) Patent No.: US 6,528,994 B2
(45) Date of Patent: Mar. 4, 2003

(54) MAGNETIC FIELD MEASUREMENT APPARATUS

(75) Inventors: Daisuke Suzuki, Kodaira (JP); Atsushi Ninomiya, Ome (JP); Tsuyoshi Miyashita, Fuchu (JP); Akihiko Kandori, Kokubunji (JP); Keiji Tsukada, Kashiwa (JP); Koichi Yokosawa, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/941,752

(22) Filed: Aug. 30, 2001

(65) Prior Publication Data
US 2002/0050815 A1 May 2, 2002

(30) Foreign Application Priority Data
Oct. 30, 2000 (JP) .................................. 2000-334921

(51) Int. Cl.$^7$ ............................................. G01R 33/02
(52) U.S. Cl. ...................................... 324/248; 600/407
(58) Field of Search ........................... 324/248, 244, 324/225, 235, 240; 600/409, 407, 425, 481, 508, 509, 512, 513, 516, 517

(56) References Cited

U.S. PATENT DOCUMENTS 4,694,837 A  * 9/1987 Blakley et al. ............. 128/653
5,729,135 A  * 3/1998 Knugai ....................... 324/240
6,424,853 B1 * 7/2002 Tsukada et al. ............. 600/409

FOREIGN PATENT DOCUMENTS

| JP | 9-214166 | 8/1997 |
| JP | 2000-77890 | 3/2000 |

* cited by examiner

Primary Examiner—Edward Lefkowitz
Assistant Examiner—Subhash A Zaveri
(74) Attorney, Agent, or Firm—Mattingly, Stanger & Malur, P.C.

(57) ABSTRACT

A magnetic field measuring apparatus has a magnetic field shielding apparatus including non-magnetic cylindrical members on which high-permeability sheets are located in a state of being partially overlapped with each other. The cylindrical members are located to surround an axis of a first direction concentrically and having a hollow portion, the cylindrical member located on an innermost-side having a first opening at one end of the first direction, a second opening at the other end of the first direction, and a third opening penetrating the cylindrical members in a direction perpendicular to the axis of the first direction. In addition, the magnetic field measuring apparatus has a living-body holder located in an inner-side space of the cylindrical member and a cryostat inserted into the third opening and maintaining SQUID magnetic-flux meters.

17 Claims, 17 Drawing Sheets

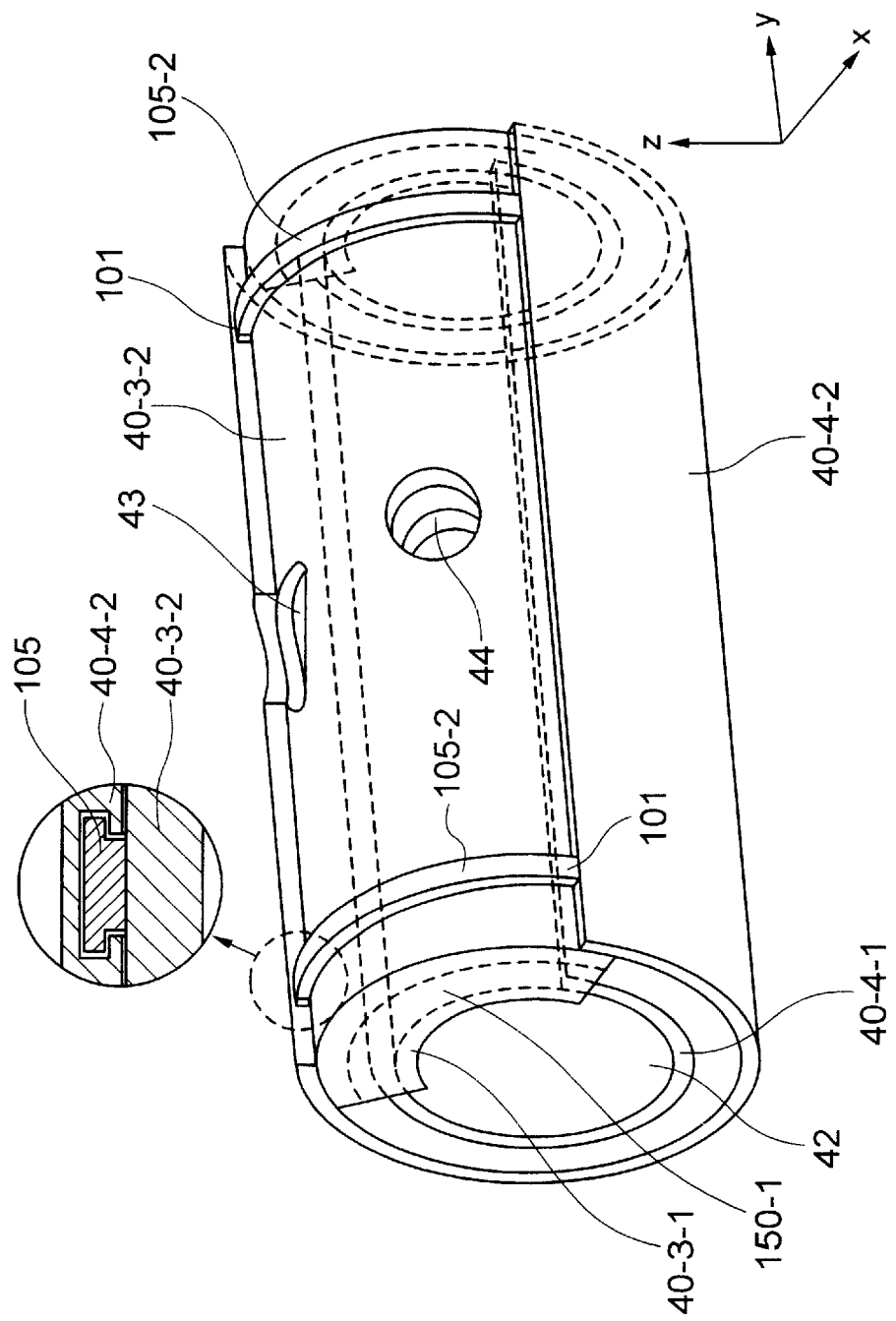

FIG. 12A
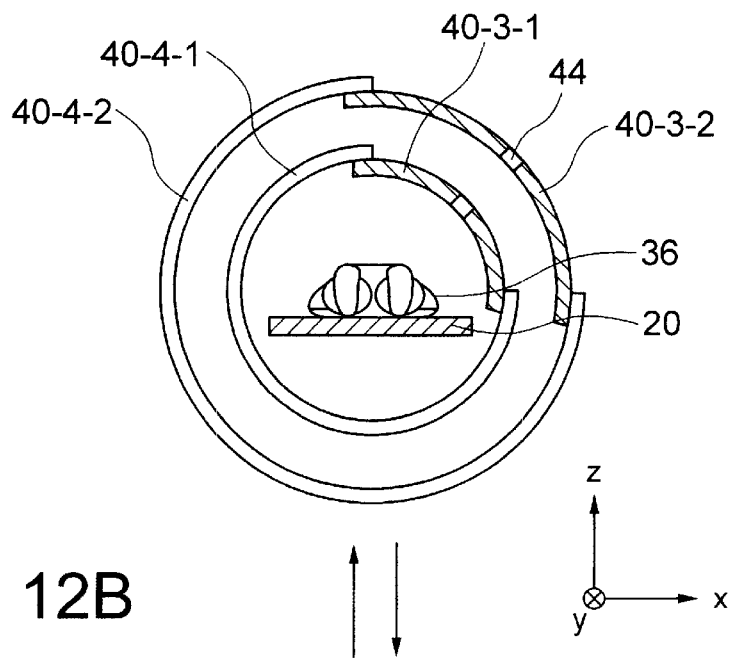
FIG. 12B
FIG. 12C
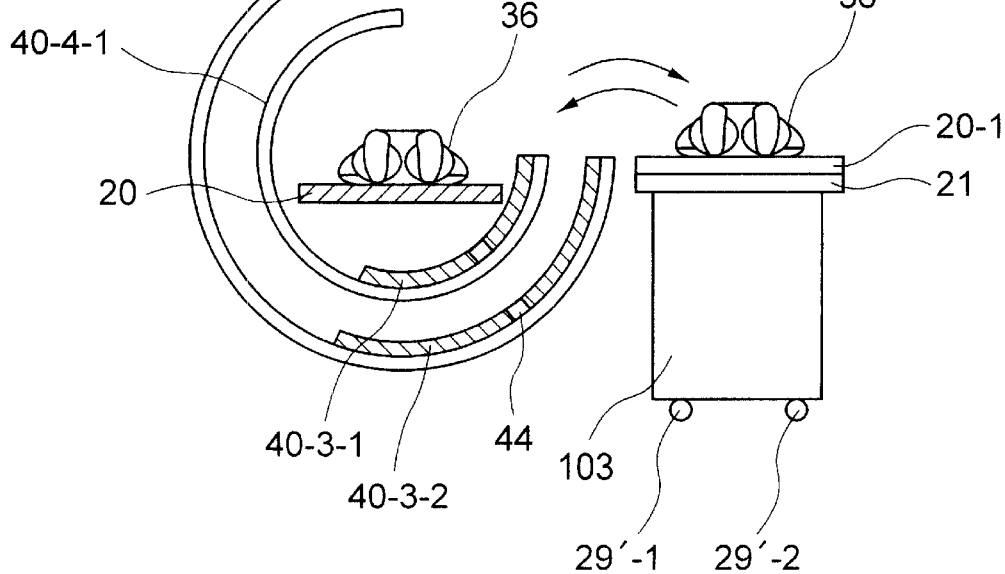

MAGNETIC FIELD MEASUREMENT APPARATUS

CROSS-REFERENCE TO RELATED APPLICATIONS

The present application is relevant to U.S. patent application Ser. No. 09/940,542 being filed by Keiji Tsukada, Tsuyoshi Miyashita, Akihiro Kandori, Daisuke Suzuki, and Kouichi Yokosawa, and assigned to the present assignee, based on Japanese Patent Application No. 2001-044424 filed on Feb. 21, 2001, and is relevant to U.S. Patent Application Serial No. 09/940,507 being filed by Kouichi Yokozawa, Daisuke Suzuki, Keiji Tsukada, Tsuyoshi Miyashita and Akihiko Kandori, and assigned to the present assignee, based on Japanese Patent Application No. 2001-044426 filed on Feb. 21, 2001. The contents of those applications are incorporated herein by reference.

BACKGROUND OF THE INVENTION

1. Field of the Invention

The present invention relates to a magnetic field shielding apparatus for measuring a magnetic field generated from an examination-target with the use of a plurality of magnetic-flux meters including high-sensitivity SQUIDs (i.e., superconducting quantum interference devices), and a magnetic field measuring method and a magnetic field measuring apparatus using the shielding apparatus. More particularly, it relates to a magnetic field shielding apparatus for measuring a biomagnetic field generated by the activity of a cardiac muscle in a living body or the like, and a biomagnetic field measuring method and a biomagnetic field measuring apparatus using the shielding apparatus.

2. Description of the Related Art

There has been reported a magnetic shield that is manufactured by locating a plurality of different-diameter cylindrical shields concentrically in sequence and by forming a spacing between the respective cylindrical shields (the prior art 1: JP-A9-214166).

In the technology described in the prior art 1, the cylindrical shield is formed as follows: Using a magnetic shielding material composed of a 0.1 to 0.5 mm-thick and 20 to 50 cm-wide tape-shaped Permalloy, the magnetic shielding material is wound in a spiral-like manner around a light-weighted plastic cylinder that is employed as the core. Then, the overlapped portion where the magnetic shielding material has been superposed without a spacing is set to be 5 to 10 cm wide, thus forming the cylindrical shield. The magnetic shielding material is wound in the spiral-like manner so that the overlapped portion is formed into substantially 2 to 5 layers and the total thickness thereof becomes equal to an order of 0.5 to 3 mm. Also, in the overlapped portion, there are provided rivets with a 30-cm interval in the circumferential direction's length. The overlapped portion is tightened and fixed by the rivets, and the contact surfaces in the overlapped portion have become contacts made between the metals.

Incidentally, the prior art 1 has described, as a conventional technology, the manufacturing of a magnetically shielded room like a prefabricated room with the use of many sheets of boards formed of the Permalloy, i.e., a Ni—Fe-based high-permeability alloy material. According to the description, this conventional technology necessitates a long time to manufacture the magnetic shield and employs a large number of configuration components, thereby resulting in a problem that the magnetic shield becomes highly expensive. The price of the magnetic shield occupies a considerably large proportion in that of a biomagnetic field measuring appliance, and accordingly it has been desired to lower the price of the magnetic shield.

There has been reported the manufacturing of a light-weighted shielded room which is performed by using, instead of the Permalloy boards as the magnetic shielding material, a magnetic shield sheet formed by pasting together a soft-magnetic amorphous alloy film and a polymer film (the prior art 2: JP-A-2000-077890).

SUMMARY OF THE INVENTION

It is an object of the present invention to provide a light-weighted, small-sized, and high-performance magnetic field shielding apparatus at a low-cost with the use of a high-permeability sheet having a high-permeability, and to provide a magnetic field measuring method and a magnetic field measuring apparatus for measuring a magnetic field generated from an examination-target, in particular, a living body.

In the conventional technology in the prior art 1 where the shielded room is manufactured by combining the Permalloy boards, there existed the following problems: A problem of necessitating an annealing processing of the Permalloy after being processed, a problem of necessitating a wide area, a problem that the shielded room is heavy and its large weight imposes a limit onto a location where the shielded room should be set, the problem that the shielded room becomes highly expensive, and the like. In the prior art 2, as compared with the prior art 1 where the shielded room is manufactured by combining the Permalloy boards, the weight of the shielded room is reduced. This makes it possible to implement the lowering of the price; however, the problem of necessitating a wide area still remains unsolved. Accordingly, it has been desired to reduce the weight of the shielded room and to lower the price thereof even further.

A representative magnetic field measuring apparatus in the present invention includes the following units: A magnetic field shielding apparatus for shielding a component of an external magnetic field in a direction perpendicular to a first direction, a cryostat for maintaining a plurality of SQUID magnetic-flux meters at a low-temperature, the plurality of SQUID magnetic-flux meters detecting a component of a magnetic field generated from an examination-target in the direction perpendicular to the first direction, an apparatus for supporting the cryostat, a driving/detecting circuit for driving the SQUID magnetic-flux meters and detecting signals from the SQUID magnetic-flux meters, a calculation processing apparatus for collecting an output from the driving/detecting circuit and executing a calculation processing, and a display apparatus for displaying an output from the calculation processing apparatus.

The magnetic field shielding apparatus in the present invention is formed by locating a plurality of non-magnetic cylindrical members having a hollow portion in such a manner that the cylindrical members surround the axis of the first direction concentrically. A plurality of high-permeability sheets having a high-permeability are located in a state of being pasted on the surface (the inner surface and/or the outer surface) of each cylindrical member so that the high-permeability sheets are overlapped with each other partially.

A cylindrical member located on the innermost-side has a first opening at one end of the first direction and a second opening at the other end of the first direction. There is formed a third opening that penetrates the plurality of cylindrical members in the direction perpendicular to the axis of the first direction. The component of the external magnetic field in the direction perpendicular to the first direction is shielded in an inner-side space of the innermost-side-located cylindrical member. In the case where the examination-target is a living body, a living-body holder (i.e., a bed or a chair) for holding the living body (i.e., the subject) in a manner of making the body-axis direction of an examination-target area substantially parallel to the axis of the first direction is located in the inner-side space of the innermost-side-located cylindrical member.

The cryostat is partially inserted into the third opening, and the bottom plane of the cryostat is located in the inner-side space. A configuration is employed where the diameter of the third opening is made smaller than that of the bottom plane of the cryostat so that the smaller-diameter portion of the cryostat is inserted into the third opening. This configuration makes it unnecessary to enlarge the diameter of the third opening, thereby making it possible to enhance the magnetic field shielding ratio for the external magnetic field. In the case where the examination-target is the living body, the third opening is opposed to a chest plane or a back plane of the living body (the subject), and the bottom plane of the cryostat is located in the above-described inner-side space in a manner of being opposed to the chest plane or the back plane of the living body.

A position adjusting apparatus adjusts the position relationship between the bottom plane of the cryostat and the surface of the examination-target, adjusting the position relationship in the direction perpendicular to the first direction. The position adjusting apparatus is capable of changing, in the second direction perpendicular to the first direction, the position of the cryostat and the position of the holder for holding the examination-target. Moreover, the position adjusting apparatus is capable of changing the position of the holder in a third direction perpendicular to the first direction and the second direction, and also in the first direction.

Furthermore, in the magnetic field shielding apparatus, a fourth opening is formed which penetrates the plurality of cylindrical members in the direction perpendicular to the axis of the first direction. In the case where the examination-target is the living body, the fourth opening exists within the field-of-view of the subject, thereby giving a sense of openness to the subject.

The present invention makes it possible to implement, using the high-permeability sheet having the high-permeability, the light-weighted, small-sized, low-cost, and high-performance magnetic field shielding apparatus having the high magnetic field shielding ratio. Since the magnetic field shielding apparatus in the present invention is the light-weighted and small-sized one, the shielding apparatus requires no specific load-bearing capability to the location where the shielding apparatus will be set, and thus the shielding apparatus is capable of being set only if there exists just a small area. This eliminates the limit imposed onto the location where the magnetic field shielding apparatus, i.e., the magnetic field measuring apparatus, should be set.

Only from the measurement of a normal component of a magnetic field without measuring 2 directions of tangent components of the magnetic field, the magnetic field shielding apparatus in the present invention makes it possible to obtain a magnetic field distribution diagram where the peak pattern appears directly above an electric current source. As a consequence, it becomes possible to directly read the positions of a plurality of electric current sources in the examination-target, in particular, the living body. This, in the case where the examination-target is the living body, makes it possible to obtain data that is useful for the diagnosis of the heart diseases of an adult or a fetus. The magnetic field shielding apparatus in the present invention allows the magnetic field from the examination-target to be measured and to be displayed in a short time.

BRIEF DESCRIPTION OF THE DRAWINGS

FIG. 11 is a perspective view for illustrating the magnetic field shielding apparatus illustrated in FIG. 10;

FIGS. 12A–12C are cross-sectional views for explaining the putting in-and-out of the examination-target (i.e., the patient) toward the biomagnetic field measuring apparatus illustrated in FIG. 7;

DESCRIPTION OF THE EMBODIMENTS

Figure 1:
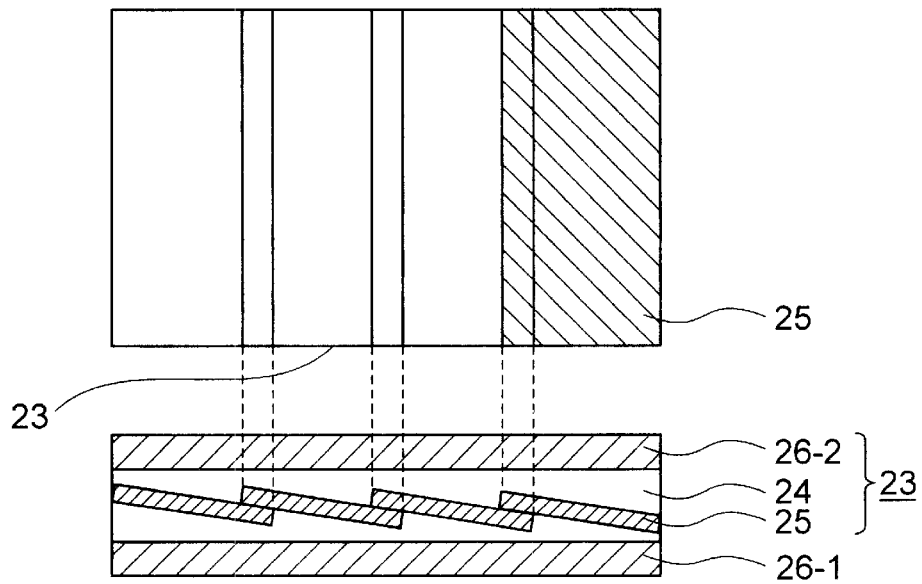
FIG. 1 is a diagram for explaining the configuration example of the high-permeability sheet having the high-permeability used in the respective embodiments of the present invention.

In the explanation given hereinafter, the explanation will be given employing, as a representative example, a heart of a living body as the examination-target. It is needless to say that the present invention is not limited to the heart of the living body, but is also applicable to the examinations of the presence or absence of magnetic substances contained in a general examination-target and the distribution of the magnetic substances. The configuration of the apparatus according to the present invention necessitates no wide area. Consequently, the apparatus is usable as, for example, an examining apparatus for a dangerous object including magnetic substances, and is also applicable to the examination of a baggage at an airport, a port, or the like.

In the magnetic field shielding apparatus according to the present invention, a plurality of high-permeability sheets are used which include a thin film of a high-permeability magnetic material composed of an amorphous material or a polycrystalline material and which have flexibility and a thin thickness. Otherwise, a plurality of high-permeability sheets are used which are formed using a high-permeability magnetic material composed of a Ni-containing alloy. The high-permeability sheets used in the present invention are of flexible character.

The plurality of high-permeability sheets are located on 2 to 5 non-magnetic cylindrical members having a hollow portion in such a manner that the high-permeability sheets overlap with each other partially. The plurality of cylindrical members are located by being fixed to each other in such a manner that the cylindrical members surround the axis of a first direction concentrically. On each of the high-permeability sheets, regions where the magnetic material is located are formed into a rectangle-shaped configuration in a state of being sandwiched between non-magnetic base sheets (e.g., papers, polymer films, or metal films). The plurality of respective rectangles overlap with each other at long sides of the rectangles adjacent thereto, and further, the long sides of the plurality of rectangles are arranged in substantially parallel to each other.

Short sides of the plurality of rectangles on each high-permeability sheet are located in substantially parallel to the axis of the first direction. The high-permeability sheets are held by being pasted on the surface (the inner surface and/or the outer surface) of each of the plurality of cylindrical members in such a manner that the long sides of the plurality of rectangles on each high-permeability sheet surround the axis of the first direction inwardly. The plurality of regions which have such a rectangle-shaped configuration and where the magnetic material is located are located, thereby making it possible to enhance the magnetic field shielding ratio for an external magnetic field.

In a cylindrical member located on the innermost-side, a first opening is formed at one end of the first direction, and a second opening is formed at the other end of the first direction. There is formed a third opening which penetrates the plurality of cylindrical members in a direction perpendicular to the axis of the first direction and into which a cryostat for maintaining a plurality of SQUID magnetic-flux meters at a low-temperature is inserted. A component of the external magnetic field in the direction perpendicular to the first direction is shielded in an inner-side space of the innermost-side-located cylindrical member.

A more desirable configuration of the cross-section of the plurality of cylindrical members perpendicular to the axis of the first direction is selected to be a circle, i.e., a highly-symmetrical configuration that is more desirable from a viewpoint of enhancing the magnetic field shielding ratio for the external magnetic field. It is also allowable, however, to select a configuration obtained by quashing the circle by about 10% of the circle's diameter in the direction perpendicular to the axis of the first direction.

A more desirable configuration of the cross-section of the innermost-side-located cylindrical member perpendicular to the axis of the first direction is an about 50 to about 200 cm-diameter circle, which prevents an oppressive feeling or a sense of being oppressed from being given to a subject who is inserted into the inside of the innermost-side-located cylindrical member. In the case of the apparatus designed for specifically examining a small child, about 50 cm is wide enough for the inner diameter of the innermost-side-located cylindrical member. In the case of the apparatus designed for examining the small child and a large-build adult as its examination-target, about 50 cm is wide enough for the inner diameter of the innermost-side-located cylindrical member.

As the plurality of non-magnetic cylindrical members, the employment of 0.5 to 1 mm-thick hollow cylinders composed of FRP (i.e., fiber-reinforced plastic) or the ones composed of aluminum is more desirable from a viewpoint of the manufacturing and the cost of the magnetic field shielding apparatus.

In the inner-side space of the innermost-side-located cylindrical member where the component of the external magnetic field in the direction perpendicular to the first direction is shielded, the subject is placed in a state of being relaxed in any one of the following 3 modes: Moreover, the body-axis direction of a region of the subject from which a biomagnetic field is to be detected is made substantially parallel to the axis of the first direction, then detecting the biomagnetic field generated from, for example, a chest portion of the subject, a fetus, inside an abdominal portion thereof, or the like.

(1) When making the axis of the first direction substantially horizontal to the floor surface, a bed in which the subject is lying is located in a state of being substantially horizontal in the inside of the innermost-side-located cylindrical member.

(2) When making the axis of the first direction substantially vertical to the floor surface, the subject is located in a state of sitting on a chair in the inside of the innermost-side-located cylindrical member.

(3) When inclining the axis of the first direction at an angle of 20 to 30 degrees to the horizontal plane, the subject is located in the inside of the innermost-side-located cylindrical member in a state of inclining the bed in which the subject is lying, or in a state of inclining the angle of the back of the chair on which the subject is sitting.

The third opening and/or a fourth opening are formed in any one of the following 3 modes: (1) A hole has been bored in each of the plurality of cylindrical members, and the cylindrical members are integrated by being fixed to each other in such a manner that the cylindrical members surround the axis of the first direction concentrically. This integration causes the holes in the respective cylindrical members to form the third opening. In addition to the mode (1), each cylindrical member is configured to be partially displaceable. Then, each cylindrical member is partially displaced, thereby forming the third opening and/or the fourth opening.

Namely, each cylindrical member is partially displaceable in any direction of the first direction, a circumferential direction surrounding the axis of the first direction, and a direction intersecting with the first direction. Then, each cylindrical member is partially displaced, thereby forming the third opening and/or the fourth opening. The concrete mode is explained below:

(2) Each cylindrical member is divided into a first portion and a second portion in the first direction. The first and the second portions of each cylindrical member are configured so that the first and the second portions are integrated by being fixed to each other in a state of each surrounding the axis of the first direction concentrically. The first portion, by being displaced in the first direction, is separable from the second portion.

The first portion of each cylindrical member has a first notch portion having an opened semicircular-portion at an edge. The second portion of each cylindrical member has a second notch portion having an opened semicircular-portion at an edge.

The displacement of the first portion with reference to the second portion in the first direction causes the edge of the first portion and the edge of the second portion to be overlapped with each other in the first direction. As a result of this, the first and the second notch portions form the third opening and/or the fourth opening.

Moreover, in addition to the first displacement of the first portion with reference to the second portion in the first direction, the second displacement in the direction intersecting with the first direction is possible. The first displacement, or the first displacement and the second displacement form an opened portion in the magnetic field shielding apparatus.

(3) Each cylindrical member is divided into a first portion and a second portion in the circumferential direction surrounding the axis of the first direction. The first and the second portions of each cylindrical member are configured so that the first and the second portions are integrated by being fixed to each other. The first portion is configured to be displaceable with reference to the second portion in the circumferential direction surrounding the axis of the first direction.

The first portion of each cylindrical member has a first notch portion having an opened semicircular-portion at one side that is substantially parallel to the first direction. The second portion of each cylindrical member has a second notch portion having an opened,semicircular-portion at one side that is substantially parallel to the first direction.

The displacement of the first portion with reference to the second portion in the circumferential direction surrounding the axis of the first direction causes the first portion and the second portion to be overlapped with each other in the circumferential direction surrounding the axis of the first direction. As a result of this, the first and the second notch portions form the third opening.

At the two sides that are substantially parallel to the first direction, the first portion and the second portion overlap with each other in the range of about 10 to 15 degrees in the circumferential direction surrounding the axis of the first direction. The displacement of the first portion forms, in the magnetic field shielding apparatus, an opened portion that falls in the range of about 90 degrees in the circumferential direction surrounding the axis of the first direction.

In another configuration of the magnetic field shielding apparatus, as explained in the above-described (2), (3), each cylindrical member is formed in being divided into the first portion and the second portion, thereby forming the third opening. In another configuration, however, a configuration is employed where the third opening explained above is not formed. The bottom portion of the cryostat is inserted from the first opening or the second opening. Since the fourth opening is formed at a position far away from the examination-target area of the subject, the fourth opening does not deteriorate the magnetic field shielding ratio for the external magnetic field.

Hereinafter, the explanation will be given concerning the procedural steps of the magnetic field measurement in the present invention.

First, each cylindrical member of the magnetic field shielding apparatus is partially displaced in any direction of the first direction, the circumferential direction surrounding the axis of the first direction, and the direction intersecting with the first direction, thereby forming the opened portion.

Through the opened portion from the direction intersecting with the axis of the first direction, a living-body is held on a living-body holder (i.e., a bed or a chair) located in the inner-side space of the magnetic field shielding apparatus. Otherwise, the living-body holder where the living body is held is transferred into the inner-side space of the magnetic field shielding apparatus through the opened portion along the axis of the first direction, or from a direction that is substantially parallel to the first direction, or from the direction intersecting with the axis of the first direction.

Next, each cylindrical member is partially displaced in any direction of the first direction, the circumferential direction surrounding the axis of the first direction, and the direction intersecting with the first direction, thereby blockading the opened portion. As a result of this, the third opening and/or the fourth opening are formed, and it turns out that the cryostat has been partially inserted into the third opening.

The position relationship between the bottom plane of the cryostat and the surface of the living body is adjusted in the direction perpendicular to the first direction so that the magnetic field signal will be detected in a large magnitude. Here, the cryostat has been located in the inner-side space of the magnetic field shielding apparatus. Next, the plurality of SQUID magnetic-flux meters detect a component of the magnetic field generated from the living body in the direction perpendicular to the first direction.

The present invention makes it possible to provide a light-weighted, small-sized, low-cost, and high-performance magnetic field shielding apparatus having a high magnetic field shielding ratio for the external magnetic field. In addition, the present invention is capable of providing a biomagnetic-field-measuring magnetic field measuring method and magnetic field measuring apparatus using this magnetic field shielding apparatus.

Also, since the magnetic field shielding apparatus in the present invention is the light-weighted and small-sized one, the shielding apparatus requires no specific load-bearing capability to a location where the shielding apparatus will be set, and thus the shielding apparatus is capable of being set only if there exists just a small area. This eliminates the limit imposed onto the location where the magnetic field shielding apparatus, i.e., the magnetic field measuring apparatus, should be set.

Here, the variables and the elements concerning the magnetic field measurement are denoted as follows: The time variable t, the living body surface (x, y) plane, the direction perpendicular to the living body surface z direction, the position of one of the SQUID magnetic-flux meters that are arranged inside the cryostat, with an equal spacing in proximity to the bottom plane thereof, and in a 2-dimentional lattice-like manner (x, y), the magnetic field component (the normal component) of the biomagnetic field detected by the SQUID magnetic-flux meters $B_z(x, y, t)$.

In the magnetic field measuring apparatus in the present invention, the tangent components $B_x(x, y, t)$, $B_y(x, y, t)$ of the biomagnetic field are determined as values proportional to the x-direction variation ratio $\partial B_z(x, y, t)/\partial x$ and the y-direction variation ratio $\partial B_z(x, y, t)/\partial y$ of the measured normal component $B_z(x, y, t)$. Letting the proportional constant be equal to 1, the tangent components $B_x(x, y, t)$, $B_y(x, y, t)$ are given by the following (equation 1) and (equation 2):
[equation 1]

$$B_x(x, y, t) = -(\partial B_z(x, y, t)/\partial x) \quad \text{(equation 1)}$$

[equation 2]

$$B_y(x, y, t) = -(\partial B_z(x, y, t)/\partial y) \quad \text{(equation 2)}$$

Next, $S_t(x, y, t)$, which is a value proportional to the square root of the square summation of the x-direction variation ratio and the y-direction variation ratio, is determined. Letting the proportional constant be equal to 1, $S_t(x, y, t)$, i.e., the magnetic field waveform, is given by the following (equation 3):
[equation 3]

$$S_t(x, y, t) = \sqrt{[\{\partial B_z(x, y, t)/\partial x\}^2 + \{\partial B_z(x, y, t)/\partial y\}^2]} \quad \text{(equation 3)}$$

The waveform $S_t(x, y, t)$ provides magnetic field intensity information where the magnetic field generating sources existing inside the living body are projected onto the (x, y) plane. Employing, as t, peak positions of the respective Q, R, S waves, an isomagnetic field map where the (x, y) points providing the same magnetic field intensity are connected is determined by the interpolation and the extrapolation from the data of $S_t(x, y, t)$ Next, the integration value I (x, y) of the magnetic field waveform $S_t(x, y, t)$ during an arbitrary time-period is determined for each point (x, y) by using the following (equation 4): Moreover, an isointegral map where the points providing the same integration value I (x, y) are connected is determined by the interpolation and the extrapolation.

When, for example, measuring a heart as the measurement target, the following are employed as the integration range: Time-periods during which the respective Q, R, S waves have been generated, a time-period of the QRS complex waves during which the S-wave has been generated from the Q-wave, a time-period during which the T-wave has been generated, and so on.
[equation 4]

$$I(x, y) = \int |S_t(x, y, t)| dt \quad \text{(equation 4)}$$

Furthermore, the time waveform V(x, y, t) of the magnetic field intensity obtained by synthesizing the 3 magnetic field components of the x, y, z directions is determined using the following (equation 5): This allows a stable magnetic field waveform to be obtained even in the case of a vigorous movement like, in particular, a fetus.
[equation 5]

$$V(x,y,t) = \sqrt{[\{\partial B_z(x,y,t)/\partial x\}^2 + \{\partial B_z(x,y,t)/\partial y\}^2 + \{B_z(x,y,t)\}^2]} \quad \text{(equation 5)}$$

Using V (x, y, t) instead of $S_t(x, y, t)$, the isomagnetic field map and the isointegral map can be determined in much the same way as described above.

In addition to displaying the magnetic field waveforms $S_t(x, y, t)$, V(x, y, t) measured by the respective SQUID magnetic-flux meters, the isomagnetic field map and the isointegral map are displayed on a display screen of the display apparatus as the magnetic field distribution map. The isomagnetic field map and the isointegral map are color-coded in accordance with the height of their contour lines, and are 3-dimentionally color-displayed, thereby making it possible to obtain the data that is useful for the diagnosis.

Namely, only from the measurement of the normal component $B_z(x, y, t)$ without measuring the tangent components $B_x(x, y, t)$, $B_y(x, y, t)$, the magnetic field measuring apparatus in the present invention is capable of obtaining the magnetic field distribution diagram where the peak pattern appears directly above an electric current source. As a consequence, it becomes possible to directly read the positions of a plurality of electric current sources inside the living body. This makes it possible to obtain the data that is useful for the diagnosis of the heart diseases, such as the diagnosis of myocardinal infarction, ischemia, arrhythmia, hypertrophic cardiomyopathy, or the like, and the estimation of a variation in the cardiac muscle state before and after the operation, and the like. In particular, the magnetic field measuring apparatus in the present invention is capable of measuring and displaying, in a short time of substantially 10 seconds or 5 minutes, the data for the diagnosis of the heart of an adult or a fetus (i.e., the magnetic field distribution).

Hereinafter, referring to the drawings, the representative embodiments will be explained more concretely and in more detail.

Figure 2:
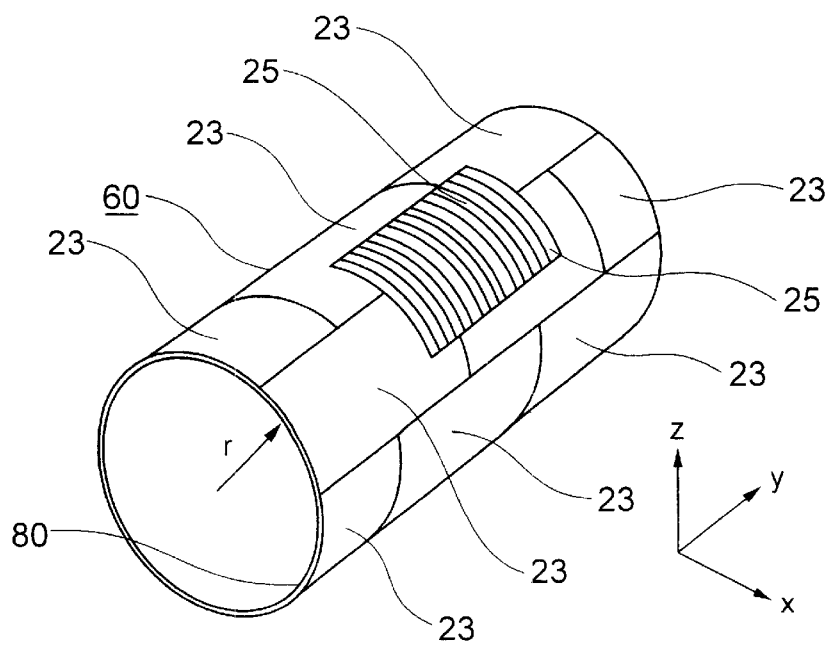
FIG. 2 is a perspective view for explaining the location example of the high-permeability sheets onto the hollow cylinder included in the magnetic field shielding apparatus in the respective embodiments of the present invention.
Figure 3:
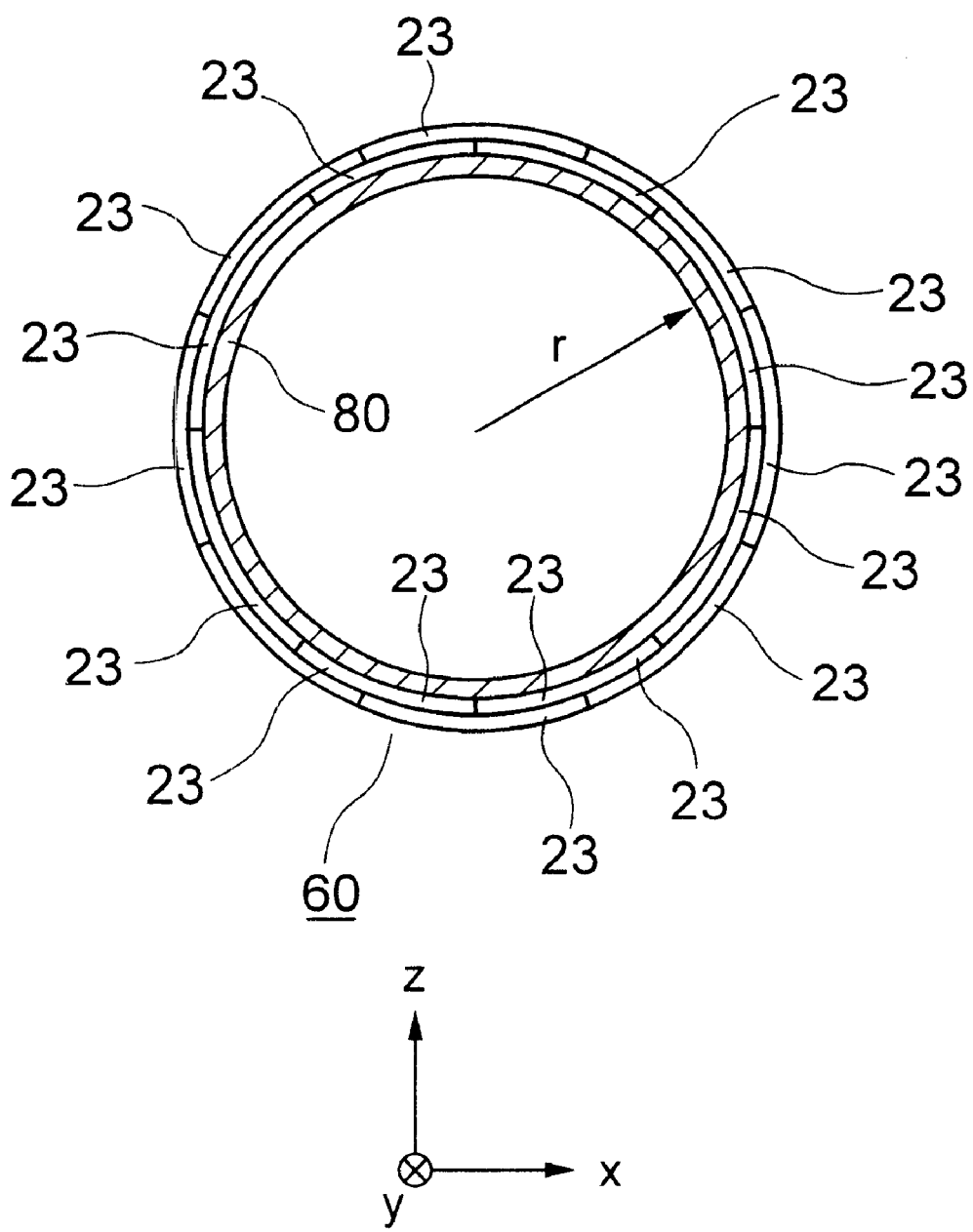
FIG. 3 is a cross-sectional view for explaining the location example of the high-permeability sheets onto the hollow cylinder included in the magnetic field shielding apparatus in the respective embodiments of the present invention.

FIG. 1 is a diagram for explaining the configuration example of the high-permeability sheet 23 having the high-permeability used in the respective embodiments of the present invention. FIG. 2 is a perspective view for explaining the location example of the high-permeability sheets onto the hollow cylinder included in the magnetic field shielding apparatus in the respective embodiments of the present invention. FIG. 3 is a cross-sectional view for explaining the location example of the high-permeability sheets onto the hollow cylinder included in the magnetic field shielding apparatus in the respective embodiments of the present invention.

The flexible high-permeability sheet 23 is configured by sandwiching the rectangle-shaped magnetic materials (i.e., magnetic-material ribbons, magnetic-material tapes) 25 between the non-magnetic base sheets 26-1, 26-2. This high-permeability sheet 23 is the same as the high-permeability sheet described in the prior art 2 . The soft-magnetic amorphous alloy is employed as the high-permeability material.

The respective rectangle-shaped magnetic-material ribbons 25 are arranged in a manner of overlapping with each other at the long side of an adjacent rectangle, and the long sides of the plurality of rectangles are arranged in substantially parallel to each other. The plurality of rectangle-shaped magnetic-material ribbons 25 are fixed between the base sheets 26-1, 26-2 by a resin or an adhesive agent 24 having a flexibility. As the typical material of the base sheets 26-1, 26-2, PET (i.e., polyethylene terephthalate) is employed. The high-permeability sheet 23 is, for example, 450 cm long and 600 cm wide in size.

The soft-magnetic amorphous alloy is an Fe—Cu—Nb—Si—B-based (Fe: 73.5%, Cu: 1%, Nb: 3%, Si: 13.5%, B: 9%) alloy the maximum relative-permeability of which is equal to 50000 or more, and has a nanocrystalline structure the crystalline grain size of which is equal to 100 n m or less.

The used magnetic-material ribbons 25 are about 20 $\mu$m thick, the base sheets 26-1, 26-2 are about 30 $\mu$m thick, and the high-permeability sheet 23 is 100 $\mu$m in total thickness. By setting the magnetic-material ribbons 25 to be 10 to 100 $\mu$m thick, the base sheets 26-1, 26-2 to be 10 to 500 $\mu$m thick, and the high-permeability sheet 23 to be 50 $\mu$m to 1.5 mm in total thickness, it becomes easy to execute the pasting and folding operation of the high-permeability sheet 23.

The magnetic field shielding apparatus in the respective embodiments of the present invention includes the plurality of magnetically-shielded cylinders 60 located coaxially. Each magnetically-shielded cylinder 60 includes a high-permeability sheet supporting cylinder 80 having a different inner-radius, and a high-permeability sheet layer 82 located on the inner circumferential surface and/or the outer circumferential surface of the high-permeability sheet supporting cylinder 80.

In each magnetically-shielded cylinder, in correspondence with the respective embodiments, there is formed the circle-shaped third opening 43 for inserting the bottom plane of the cryostat into the inside of the innermost-side-located magnetically-shielded cylinder. Moreover, the circle-shaped fourth opening 44 is formed within the field-of-view of the patient located in the inside of the innermost-side-located magnetically-shielded cylinder. Accordingly, the patient can have a talk with the doctor with his or her eyes meeting the doctor's.

FIG. 2 illustrates one of the magnetically-shielded cylinders 60. Here, the plurality of high-permeability sheets 23 are pasted on the outer circumferential surface of the high-permeability sheet supporting cylinder 80 with the use of the adhesive agent or the like, thereby forming the high-permeability sheet layer 82. A 0.5-mm inner-radius r hollow cylinder composed of aluminum is employed as the high-permeability sheet supporting cylinder 80.

The pasting of the high-permeability sheets 23 is performed using any one of the following methods: (1) The plurality of high-permeability sheets 23 are pasted so that the sheets have mutually overlapped portions. (2) Upper-layer high-permeability sheets 23 are pasted in such a manner that the upper-layer sheets cover the overlapped portions of lower-layer high-permeability sheets 23. (3) The pasting is performed by combining the method (1) with the method (2). In any one of the methods, the plurality of high-permeability sheets 23 are pasted in a manner of being overlapped so that the mutual overlaps of the high-permeability sheets 23 causes the portions of the magnetic-material ribbons 25 to be overlapped mutually.

Each high-permeability sheet 23 is pasted on the high-permeability sheet supporting cylinder 80 with the use of the adhesive agent or the like so that the short side of each magnetic-material ribbon 25 becomes substantially parallel to the central axis of the high-permeability sheet supporting cylinder 80, and so that the long side of each magnetic-material ribbon 25 surrounds the central axis of a holding cylinder 80 inwardly and the long side becomes substantially parallel to a plane perpendicular to the central axis of the high-permeability sheet supporting cylinder 80. In this way, the plurality of layers of the high-permeability sheets 23 are formed.

FIG. 3 illustrates the high-permeability sheet layer 82 formed by the 2-layer high-permeability sheets 23. In FIG. 3, the overlaps of the high-permeability sheets 23 in the respective first and second layers are omitted.

In the magnetic field shielding apparatus in the respective embodiments of the present invention, the high-permeability sheet supporting cylinder 80 included in each of the plurality of coaxially located magnetically-shielded cylinders 60 has the different inner-radius. The spacing between the high-permeability sheet supporting cylinders 80 adjacent to each other falls in the range of 1 cm to 20 cm. Inside the innermost-side magnetically-shielded cylinder and with a high magnetic field shielding ratio, the above-explained configuration of the magnetic field shielding apparatus makes it possible to shield a component of the external magnetic field in the direction perpendicular to the central axis of the plurality of magnetically-shielded cylinders 60. Although, in the respective embodiments hereinafter, a configuration of the magnetic field shielding apparatus having the 2 magnetically-shielded cylinders will be presented as an example in order to simplify the drawing, a configuration of the magnetic field shielding apparatus having the 2 to 5 magnetically-shielded cylinders is also allowable.

In the explanation of the respective embodiments hereinafter, for simplicity, the central axis of the plurality of coaxially located magnetically-shielded cylinders 60 is referred to as "the central axis of the magnetic field shielding apparatus". Moreover, in the explanation of the respective embodiments hereinafter, in the case as well where each cylinder of the plurality of magnetically-shielded cylinders 60 is configured by being divided into 2 portions in the direction perpendicular to its central axis, or each cylinder is configured by being divided into 2 portions in its circumferential direction, and these 2 portions are caused to be overlapped with each other so as to configure each cylinder of the plurality of magnetically-shielded cylinders 60, the central axis of the plurality of magnetically-shielded cylinders that are configured by being caused to be overlapped and are located along the axis common thereto is similarly referred to as "the central axis of the magnetic field shielding apparatus".

First Embodiment

Figure 4:
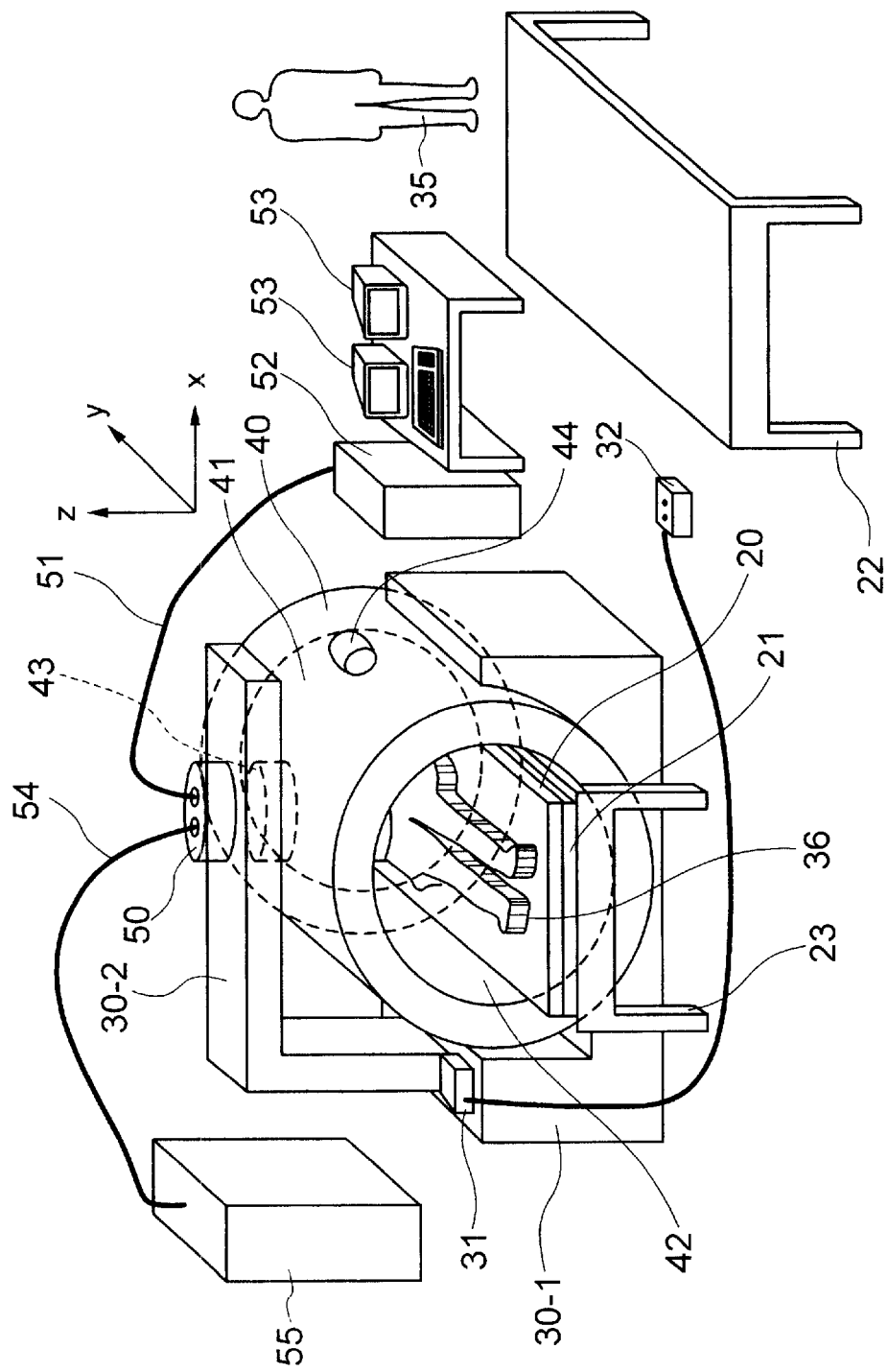
FIG. 4 is a perspective view for illustrating the configuration example of the biomagnetic field measuring apparatus in a first embodiment of the present invention.
Figure 5:
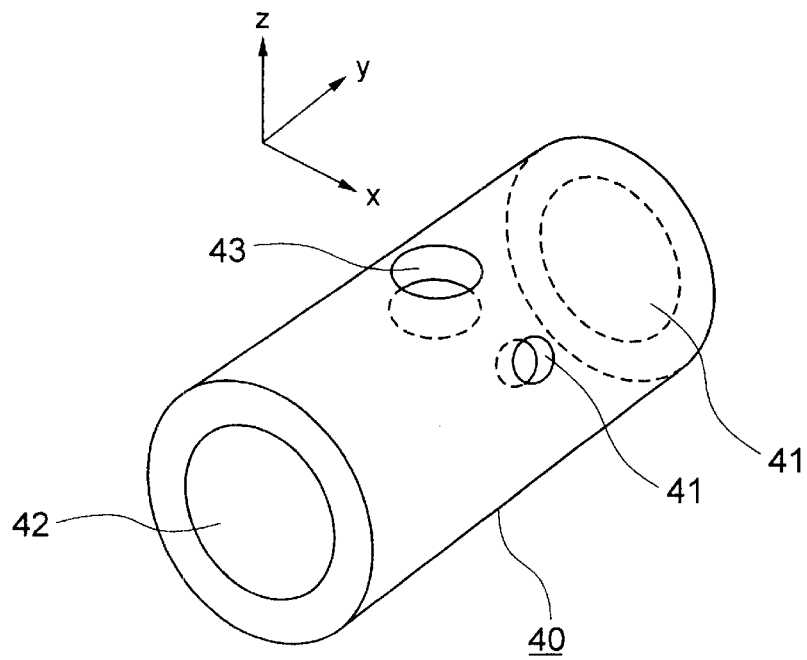
FIG. 5 is a perspective view for illustrating the magnetic field shielding apparatus illustrated in FIG. 4.
Figure 6:
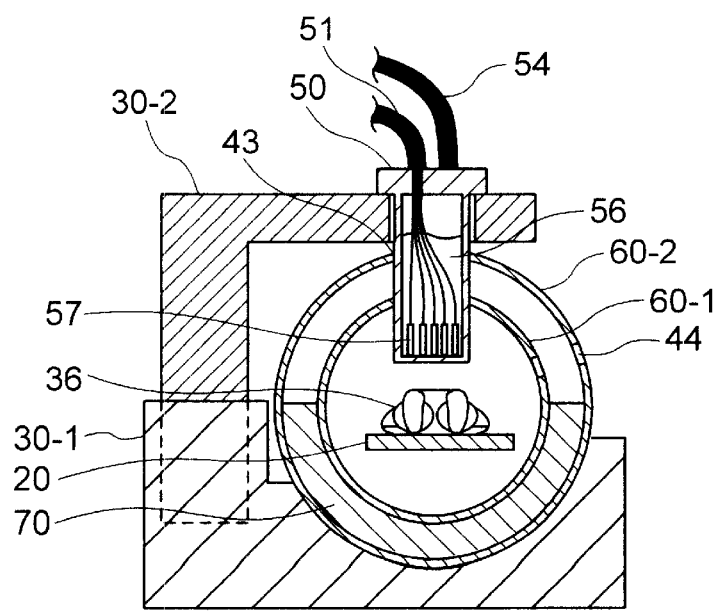
FIG. 6 is a cross-sectional view of the biomagnetic field measuring apparatus illustrated in FIG. 4 in a plane passing through the center of its measuring field-of-view.

FIG. 4 is a perspective view for illustrating the configuration example of the biomagnetic field measuring apparatus in a first embodiment of the present invention. FIG. 5 is a perspective view for illustrating the. magnetic field shielding apparatus 40 illustrated in FIG. 4. FIG. 6 is a cross-sectional view of the biomagnetic field measuring apparatus illustrated in FIG. 4 in a plane passing through the center of its measuring field-of-view.

The biomagnetic field measuring apparatus includes the following components: The magnetic field shielding apparatus 40, the cryostat 50 for maintaining the plurality of SQUID magnetic-flux meters 57 at a low-temperature, the plurality of SQUID magnetic-flux meters 57 detecting the magnetic field (the biomagnetic field) generated from the examination-target (the living body), a gantry 30-2 for supporting the cryostat 50, a magnetic field shielding apparatus/gantry supporting base 30-1 for supporting the magnetic field shielding apparatus 40 and the gantry 30-2, a coolant supply apparatus or cryocooler 55 and a coolant supply line or a heat transmission line 54 for cooling the inside of the cryostat 50, a data acquisition process/sensor control apparatus 52 for driving and controlling the SQUID magnetic-flux meters 57 via a data acquisition/sensor control line 51 to acquire the detected biomagnetic field and to execute the data processing, a singular display apparatus 53 or plural display apparatuses 53 for displaying the result of the data processing.

The inside of the cryostat 50 is cooled by liquid He supplied from the coolant supply apparatus 55 via the coolant supply line 54. Otherwise, He gas cooled using a refrigerator as the cryocooler 55 is supplied by a compressor via the heat transmission line 54 to a cold head located inside the cryostat 50, thereby cooling the inside of the cryostat 50.

The magnetic field shielding apparatus 40, which includes the plurality of magnetically-shielded cylinders 60 explained in FIGS. 2 and 3, has the following openings, respectively: The first opening 41 in the positive direction of the central axis (i.e., y direction) of the plurality of magnetically-shielded cylinders, the second opening 42 in the negative direction of the y direction, the third opening 43 that penetrates the plurality of magnetically-shielded cylinders for inserting the cryostat in an upper portion of the direction (i.e., z direction) perpendicular to the central axis, the fourth opening 44 that penetrates the plurality of magnetically-shielded cylinders for observing the examination-target who is lying in the bed 20. The central axis (y direction) (i.e., the central axis of the magnetic field shielding apparatus 40) of the plurality of magnetically-shielded cylinders is horizontal to the floor surface.

Inside the innermost-side magetically-shielded cylinder 60-1 and with the high magnetic field shielding ratio, the magnetic field shielding apparatus 40 shields the component of the external magnetic field in the direction perpendicular to the central axis of the magnetic field shielding apparatus 40. As a consequence, the SQUID magnetic-flux meters 57 are capable of detecting, with a high-sensitivity, a z-direction component of the biomagnetic field generated inside the magnetic field shielding apparatus 40.

The height of the gantry 30-2 is controlled and fixed by a gantry-height control apparatus 31. While observing, from the fourth opening 44, the position relationship between an examination area of the examination-target (i.e., the patient) 36 who is lying in the bed 20 and the bottom plane of the cryostat 50, the operator (i.e., the doctor) 35 operates a gantry-height control operation box 32. A signal transmitted from the gantry-height control operation box 32 controls the gantry-height control apparatus 31, thereby fixing the z-direction position of the bottom plane of the cryostat 50. The x direction is set to be a direction that is orthogonal to both the y direction and the z direction.

The plurality of SQUID magnetic-flux meters 57, which are located on a plane (i.e., a measurement plane) that is parallel to the (x, y) plane in proximity to the bottom portion inside the cryostat 50, are driven by a FLL circuit (i.e., Flux-Locked-Loop circuit) in the data acquisition.process/sensor control apparatus 52. The FLL circuit outputs a biomagnetic field signal detected by the SQUID magnetic-flux meters. The output from the FLL circuit is subjected to a filtering, and is amplified so as to be converted into digital data by an A/D converter, then being stored into a memory apparatus in the data acquisition.process/sensor control apparatus 52. As a result of having been subjected to the data processing by the data acquisition.process/sensor control apparatus 52, for example, the isomagnetic field map, the isointegral map, and the like based on the magnetic field waveforms $S_z(x, y, t)$ ((equation 3)), $V(x, y, t)$ ((equation 5)) are displayed on the display screen of the display apparatus.

The bed 20 on which the examination-target 36 is mounted is mounted on an XY-stage 21. The XY-stage 21 is fixed onto a supporting base 22. The bed 20 is located inside the innermost-side magnetically-shielded cylinder of the magnetic field shielding apparatus 40.

Incidentally, with the height of the bottom plane of the cryostat 50 set to be a fixed position, an XYZ-stage is also usable instead of the XY-stage 21. In this case, the position relationship between the gantry 30-2 and the magnetic field shielding apparatus 40 is as follows: Namely, the position of the gantry 30-2 is fixed, or the gantry 30-2 and the magnetic field shielding apparatus/gantry supporting base 30-1 are integrally configured, so that the measurement plane on which detection coils of the plurality of SQUID magnetic-flux meters 57 are arranged substantially coincides with the central axis of the innermost-side magnetically-shielded cylinder 60-1. Of course, the gantry-height control apparatus 31 and the gantry-height control operation box 32 become unnecessary.

While observing, from the fourth opening 44, the position relationship between the examination area of the examination-target (patient) 36 on the bed 20 and the bottom plane of the cryostat 50, the operator (doctor) 35 operates an XYZ-stage control operation box (not illustrated) instead of the gantry-height control operation box 32. A signal transmitted from the XYZ-stage control operation box controls the XYZ-stage of the bed 20, thereby fixing the x, y, and z-direction positions of the bed 20.

In the above-described explanation, the operator (doctor) 35 observes the patient 36 through the fourth opening 44. In a configuration where the fourth opening 44, is not provided, however, it is needless to say that the operator 35 may observe the patient 36 through the first opening 41 or the second opening 42.

The fourth opening 44 formed within the field-of-view of the patient 36 gives a sense of openness to the patient 36. At the same time, the operator (doctor) 35 can have a talk with the patient quite near through the fourth opening 44, thereby being able to observe the state of the patient accurately. The operator (doctor) 35 can easily convey an instruction to the patient 36. The patient can see the outside of the magnetic field shielding apparatus 40 through the fourth opening 44. This results in an effect of reducing a sense of psychological uneasiness or the like.

As illustrated in FIG. 5, the central axis of the third opening 43 penetrating the plurality of magnetically-shielded cylinders and the central axis of the fourth opening 44 penetrating the plurality of magnetically-shielded cylinders form an angle of about 45 degrees. As illustrated in FIG. 6, in the bottom portion inside the cryostat 50, the SQUID magnetic-flux meters 57 are arranged in a 2-dimentional manner. The inside of the cryostat 50 is filled with a coolant 56.

Each magnetically-shielded cylinder 60 is configured by a first magnetically-shielded cylinder 60-1 and a second magnetically-shielded cylinder 60-2. A space between the first magnetically-shielded cylinder 60-1 and the second magnetically-shielded cylinder 60-2 is filled with a filling agent 70, thereby stably holding the configuration of the first magnetically-shielded cylinder 60-1 and that of the second magnetically-shielded cylinder 60-2. Although, in the example illustrated in FIG. 6, the lower half is filled with the filling agent 70, the area of the upper half excluding the third opening 43 and the fourth opening 44 may be filled with the filling agent further. A hard-polyurethane containing a foaming agent or the like can be employed as the filling agent 70. The hard-polyurethane containing the foaming agent is light-weighted. Consequently, the filling with the hard-polyurethane of the area of the upper half excluding the third opening 43 and the fourth opening 44 will not deform the configuration of the first magnetically-shielded cylinder 60-1 and that of the second magnetically-shielded cylinder 60-2.

Second Embodiment

Figure 7:
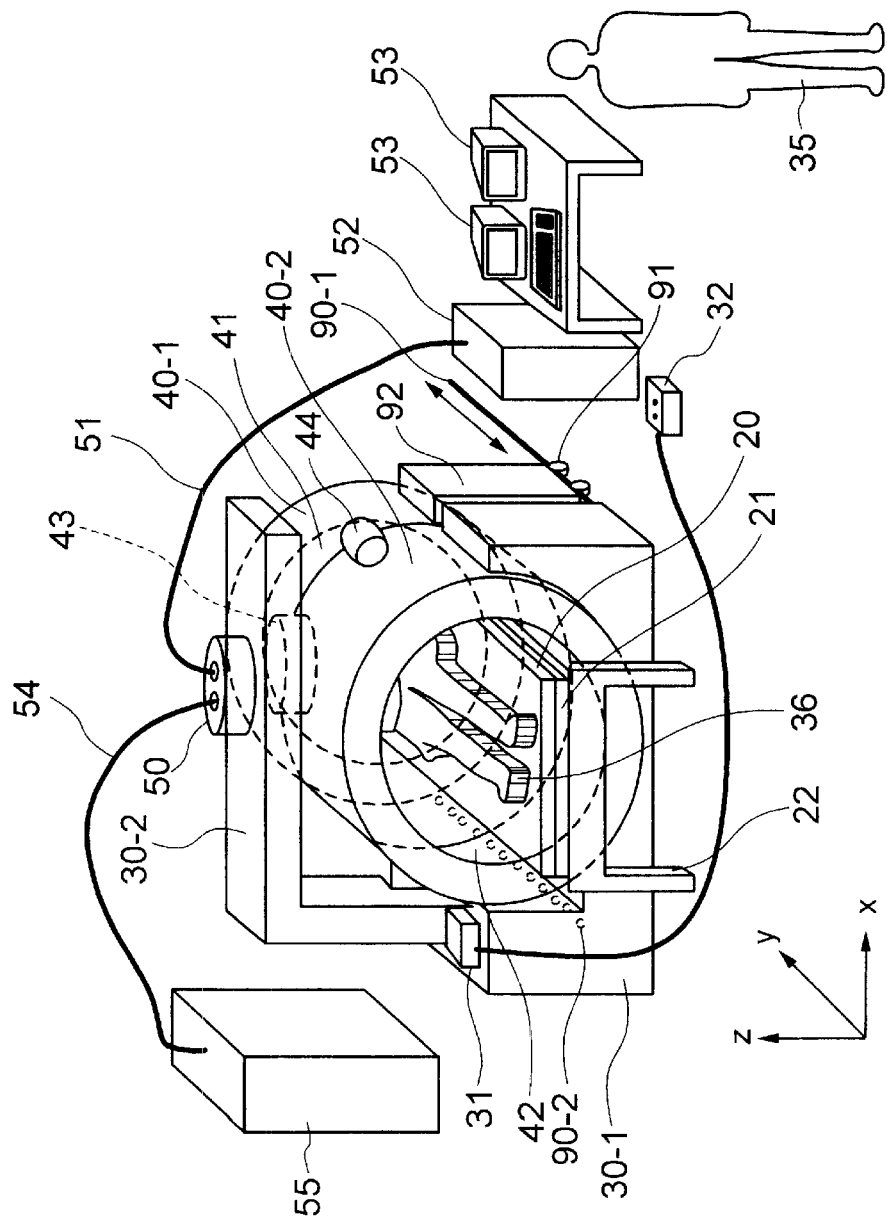
FIG. 7 is a perspective view for illustrating the configuration example of the biomagnetic field measuring apparatus in a second embodiment of the present invention.
Figure 8:
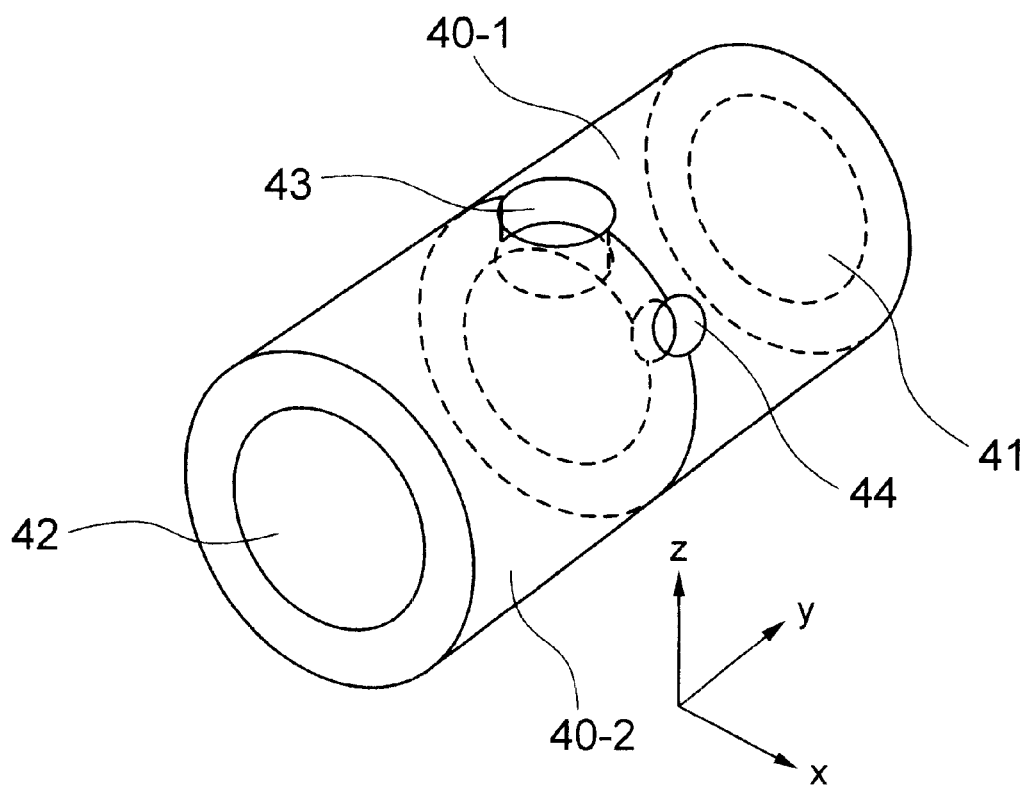
FIG. 8 is a perspective view for illustrating the magnetic field shielding apparatus illustrated in FIG. 7.
Figure 9:
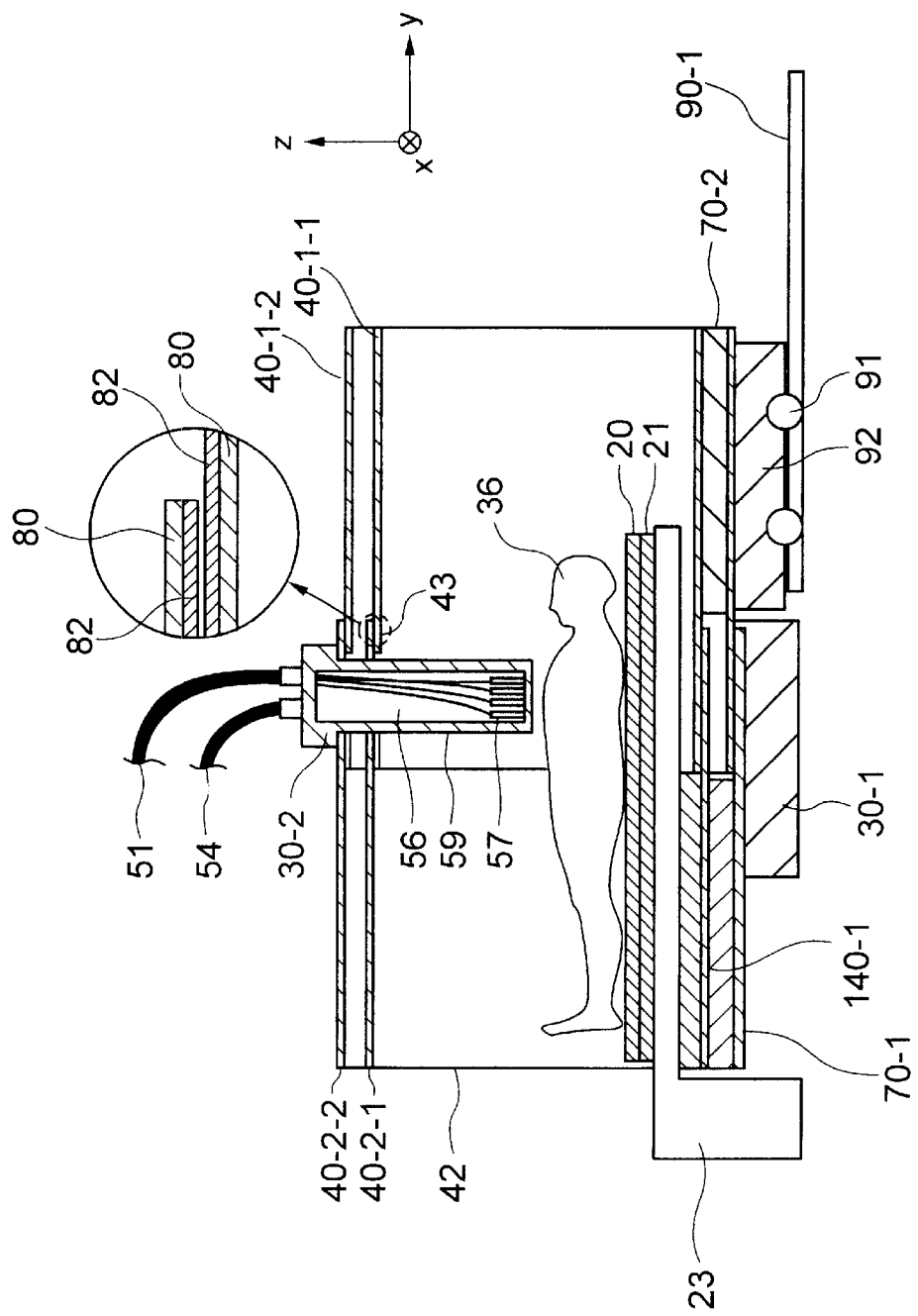
FIG. 9 is a cross-sectional view of the biomagnetic field measuring apparatus illustrated in FIG. 7 in a plane passing through the center of its measuring field-of-view.

FIG. 7 is a perspective view for illustrating the configuration example of the biomagnetic field measuring apparatus in a second embodiment of the present invention. FIG. 8 is a perspective view for illustrating the magnetic field shielding apparatus illustrated in FIG. 7. FIG. 9 is a cross-sectional view of the biomagnetic field measuring apparatus illustrated in FIG. 7 in a plane passing through the center of its measuring field-of-view, including a partially enlarged cross-section of the measuring apparatus.

Hereinafter, the explanation will be given mainly concerning the points differing from those in the first embodiment. In the configuration of the biomagnetic field measuring apparatus in the second embodiment, the magnetic field shielding apparatus 40 explained in the first embodiment is divided into 2 portions in the y direction, thereby being configured by a first portion 40-1 of the magnetic field shielding apparatus and a second portion 40-2 thereof. The first portion 40-1 of the magnetic field shielding apparatus is configured to be displaceable in the y direction with reference to the second portion 40-2 thereof. As is the case with the first Embodiment, the gantry 30-2 and the second portion 40-2 of the magnetic field shielding apparatus are supported by the magnetic field shielding apparatus/gantry supporting base 30-1.

The first portion 40-1 of the magnetic field shielding apparatus is supported by and fixed onto a magnetic field shielding apparatus supporting base 92. A plurality of wheels 91 located under the magnetic field shielding apparatus supporting base 92 are mounted on rails 90-1, 90-2 located on the surface of a floor 117. The first portion 40-1 of the magnetic field shielding apparatus is displaceable in the y direction on the rails 90-1, 90-2. This displacement allows the first portion 40-1 of the magnetic field shielding apparatus to be separated from the second portion 40-2 of the magnetic field shielding apparatus.

As a consequence, in an open space, the doctor 35, in a relaxed posture, can mount the patient 36 onto the bed 20, and the patient 36 can lie in the bed 20 in a relaxed manner. The patient is mounted thereon so that the foot portion passes through the lower portion of the cryostat first and, finally, the chest portion reaches the lower portion of the cryostat. The doctor 35 can adjust, with a high-efficiency, the position relationship between the examination area of the patient 36 and the bottom plane of the cryostat 50. After the adjustment, the doctor displaces the separated first portion 40-1 of the magnetic field shielding apparatus so as to cause the first portion 40-1 of the magnetic field shielding apparatus and the second portion 40-2 thereof to be overlapped with each other in the y direction, thereby being able to form the third opening 43 and the fourth opening 44.

As a consequence, inside innermost-side magnetically-shielded cylinders 40-1-1, 40-2-1 and with a high magnetic field shielding ratio, it becomes possible to shield the component of the external magnetic field in the direction perpendicular to the central axis of the magnetic field shielding apparatus 40. In the space where the external magnetic field has been shielded with the high magnetic field shielding ratio, it becomes possible to detect, with a high-sensitivity, the z-direction component of the biomagnetic field generated from the examination area.

As illustrated in FIG. 8, the magetically-shielded cylinders included in the first portion 40-1 of the magnetic field shielding apparatus and the magnetically-shielded cylinders included in the second portion 40-2 thereof have a notch portion having a partial circumference, respectively, so that they form the third opening 43 and the fourth opening 44 when they are caused to be overlapped with each other.

As illustrated in FIG. 9, the magnetic field shielding apparatus 40 includes the first portion 40-1 of the magnetic field shielding apparatus and the second portion 40-2 thereof. The first portion 40-1 of the magnetic field shielding apparatus includes the first magnetically-shielded inner-side cylinder 40-1-1 and a second magnetically-shielded outer-side cylinder 40-1-2. The second portion 40-2 of the magnetic field shielding apparatus includes the first magetically-shielded inner-side cylinder 40-2-1 and a second magnetically-shielded outer-side cylinder 40-2-2.

The second magnetically-shielded outer-side cylinder 40-1-2 is located in the inner-side of the second magnetically-shielded outer-side cylinder 40-2-2 in a state of being overlapped with each other. The first magnetically-shielded inner-side cylinder 40-1-1 is located in the inner-side of the first magetically-shielded inner-side cylinder 40-2-1 in a state of being overlapped with each other. FIG. 9 illustrates the third opening 43 in this overlapped portion.

As illustrated in the partially enlarged cross-section, the high-permeability sheet layer 82 is formed by the high-permeability sheets 23 in the inner-sides of the respective high-permeability sheet supporting cylinders 80 of the first magetically-shielded inner-side cylinder 40-2-1 and the second magnetically-shielded outer-side cylinder 40-2-2. The high-permeability sheet layer 82 is formed by the high-permeability sheets 23 in the outer-sides of the respective high-permeability sheet supporting cylinders 80 of the first magnetically-shielded inner-side cylinder 40-1-1 and the second magnetically-shielded outer-side cylinder 40-1-2. As a result, a configuration is employed where, in the overlapped portion, the high-permeability sheet layers 82 are caused to be in close proximity to each other. This configuration decreases a leaking magnetic-flux, thereby enhancing the magnetic field shielding factor.

Also, the following distances are set to be in the range of about ½nd to about ¼th of the diameter of the third opening: In the direction parallel to the central axis of the magnetic field shielding apparatus 40 and outside the third opening, the distance at which the second magnetically-shielded outer-side cylinder 40-2-2 and the first magetically-shielded outer-side cylinder 40-1-2 are overlapped with each other, and the distance at which the first magnetically-shielded inner-side cylinder 40-2-1 and the first magnetically-shielded inner-side cylinder 40-1-1 are overlapped with each other. The overlapped portion is made large enough, thereby enhancing the magnetic field shielding factor.

The bed-and-stage supporting base 22 on which the bed 20 and the XY-stage 21 are mounted is located inside the first magnetically-shielded inner-side cylinder 40-2-1 through a spacer 140-1. With the objective similar to that in the first embodiment, the lower half of a space between the first magetically-shielded inner-side cylinder 40-2-1 and the second magnetically-shielded outer-side cylinder 40-2-2 is filled with a filling agent 70-1, and the lower half of a space between the first magnetically-shielded inner-side cylinder 40-1-1 and the second magnetically-shielded outer-side cylinder 40-1-2 is filled with a filling agent 70-2. It is needless to say that, although the lower half is filled with the filling agents 70-1, 70-2 in the example illustrated in FIG. 9, the area of the upper half excluding the third opening 43 and the fourth opening 44 may be filled with the filling agents further.

Incidentally, as is the case with the first embodiment, it is needless to say that, with the height of the bottom plane of the cryostat 50 set to be a fixed position, the XYZ-stage of the bed 20 is also usable instead of the XY-stage 21. Moreover, as is the case with the first embodiment, it is needless to say that the configuration where the fourth opening 44 is not provided may be employed.

Third Embodiment

Figure 10:
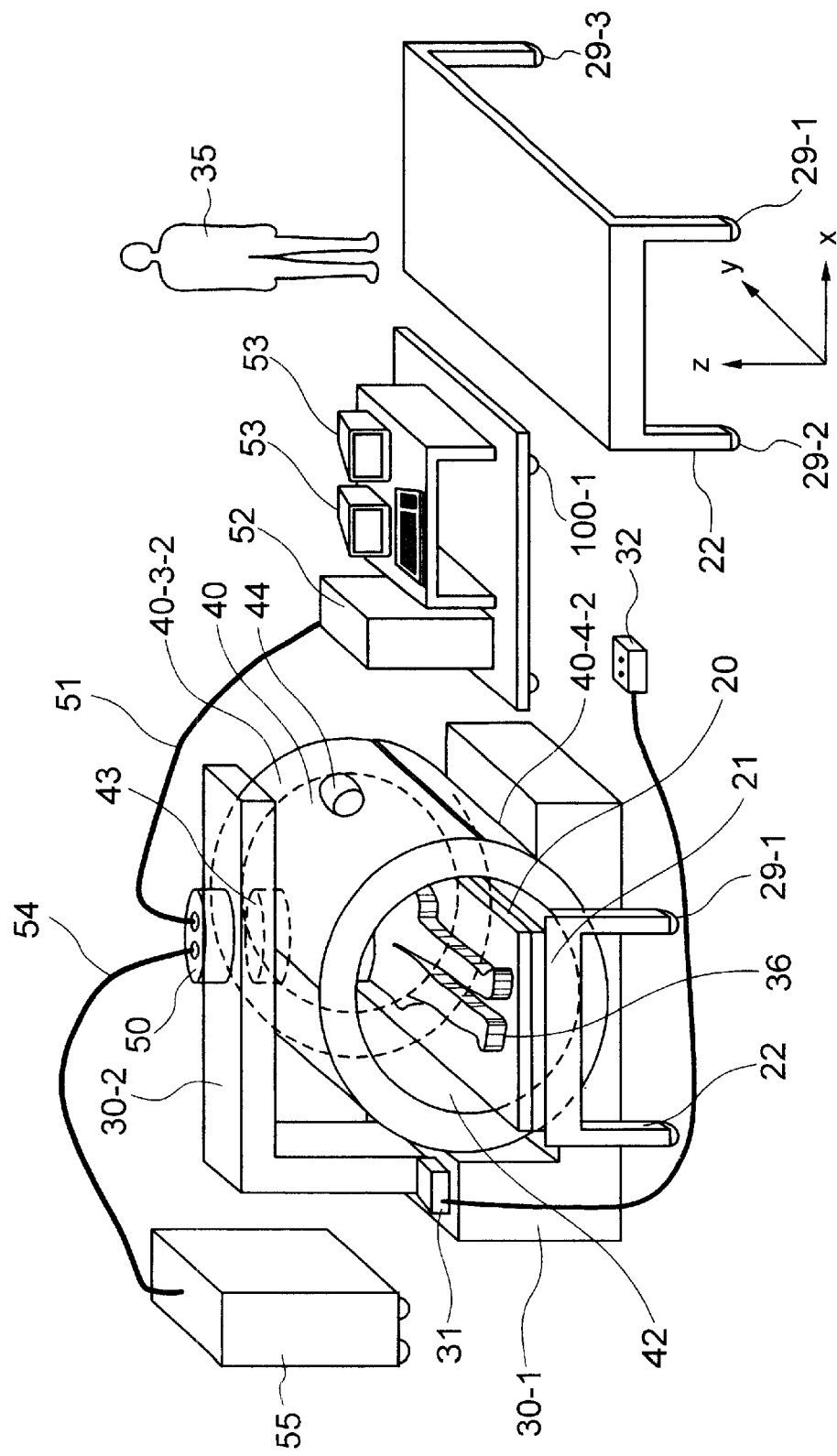
FIG. 10 is a perspective view for illustrating the configuration example of the biomagnetic field measuring apparatus in a third embodiment of the present invention.

FIG. 10 is a perspective view for illustrating the configuration example of the biomagnetic field measuring apparatus in a third embodiment of the present invention. FIG. 11 is a perspective view for illustrating the magnetic field shielding apparatus illustrated in FIG. 10, including a partially enlarged cross-section of the shielding apparatus. FIG. 12 is a cross-sectional view for explaining the putting in-and-out of the examination-target (i.e., the patient) toward the biomagnetic field measuring apparatus illustrated in FIG. 7, including a partially enlarged cross-section of the measuring apparatus.

Hereinafter, the explanation will be given mainly concerning the points differing from those in the first embodiment. The magnetic field shielding apparatus 40 explained in the first embodiment is divided into 2 portions in the circumferential direction, thereby being configured by a first portion 40-3 of the magnetic field shielding apparatus and a second portion 40-4 thereof. The first portion 40-3 of the magnetic field shielding apparatus is configured to be displaceable in the circumferential direction with reference to the second portion 40-4 thereof. As is the case with the first embodiment, the gantry 30-2 and the second portion 40-4 of the magnetic field shielding apparatus are supported by the magnetic field shielding apparatus/gantry supporting base 30-1.

As illustrated in FIGS. 11 and 12, the first portion 40-3 of the magnetic field shielding apparatus includes a first magnetically-shielded inner-side member for inner cylinder 40-3-1 and a second magnetically-shielded outer-side member for outer cylinder 40-3-2 (which are connected by a connecting plate 150-1 at edge portions in the positive and the negative directions in the y direction). Similarly, the second portion 40-4 of the magnetic field shielding apparatus includes a first magnetically-shielded inner-side member for inner cylinder 40-4-1 and a second magnetically-shielded outer-side member for outer cylinder 40-4-2 which are connected by a connecting plate 150-2 (not illustrated) at edge portions in the positive and the negative directions in the y direction. As illustrated in FIGS. 10, 11, and 12, there is formed the fourth opening 44 penetrating the first magnetically-shielded inner-side member for inner cylinder 40-3-1 and the second magnetically-shielded outer-side member for outer cylinder 40-3-2.

The inner-side of the fourth opening 44 with reference to the first magnetically-shielded inner-side cylinder 40-3-1, and the outer-side thereof with reference to the second magnetically-shielded outer-side member for outer cylinder 40-3-2 are each covered with a transparent curved-surface plate. This plate prevents a hand, clothes, and the like from getting caught and sandwiched when the first portion 40-3 of the magnetic field shielding apparatus is displaced in the circumferential direction with reference to the second portion 40-4 thereof.

The following configuration is employed: The first portion 40-3 of the magnetic field shielding apparatus has a circumferential portion of about 110 degrees, and the second portion 40-4 thereof has a circumferential portion of about 270 degrees. Moreover, the first portion and the second portion are overlapped with each other at both of the edge portions and in the range of about 10 degrees, respectively. Namely, when overlapped with each other at both of the edge portions parallel to the central axis of the magnetic field shielding apparatus and in the range of about 10 degrees, the first magnetically-shielded inner-side member for inner cylinder 40-3-1 and the first magnetically-shielded inner-side member for inner cylinder 40-4-1, and the second magnetically-shielded outer-side member for outer cylinder 40-3-2 and the second magnetically-shielded outer-side member for outer cylinder 40-4-2 form the magnetic field shielding apparatus existing in a closed state, respectively. Meanwhile, when overlapped in the range of about 110 degrees, they each form the magnetic field shielding apparatus having the openings and existing in an opened state. The overlapped portion is made large enough in the closed state, thereby enhancing the magnetic field shielding factor.

As illustrated in the partially enlarged cross-section, a T-character-shaped long-and-slim plate is located as a guide 105-2 on the circumferential surface of the outer-plane of the high-permeability sheet supporting cylinder 80 of the second magnetically-shielded outer-side member for outer cylinder 40-3-2. A T-character-shaped long-and-slim groove for receiving the guide 105-2 is located on the circumferential surface of the inner-plane of the high-permeability sheet supporting cylinder 80 of the second magnetically-shielded outer-side member for outer cylinder 40-4-2.

Similarly, a T-character-shaped long-and-slim plate is located as a guide 105-1 on the circumferential surface of the outer-plane of the high-permeability sheet supporting cylinder 80 of the first magnetically-shielded inner-side member for inner cylinder 40-3-1. A T-character-shaped long-and-slim groove (not illustrated) for receiving the guide 105-1 is located on the circumferential surface of the inner-plane of the high-permeability sheet supporting cylinder 80 of the first magnetically-shielded inner-side member for inner cylinder 40-4-1.

Incidentally, the high-permeability sheets 23 form the high-permeability sheet layer 82 on the outer-planes of the respective high-permeability sheet supporting cylinders of the first magnetically-shielded inner-side member for inner cylinder 40-4-1 and the second magnetically-shielded outer-side member for outer cylinder 40-4-2, and on the inner-planes of the respective high-permeability sheet supporting cylinders of the first magnetically-shielded inner-side member for inner cylinder 40-3-1 and the second magnetically-shielded outer-side member for outer cylinder 40-3-2, respectively.

As illustrated in FIG. 11, the magnetically-shielded cylinders included in the first portion 40-3 of the magnetic field shielding apparatus and the magnetically-shielded cylinders included in the second portion 40-4 thereof have a notch portion having a partial circumference, respectively, so that they form the third opening 43 when they are caused to be overlapped with each other.

FIG. 12A illustrates the state where the patient 36 is lying in the bed 20 and the biomagnetic field generated from an examination area is measured. The magnetically-shielded cylinders included in the first portion 40-3 of the magnetic field shielding apparatus and the magnetically-shielded cylinders included in the second portion 40-4 thereof are overlapped with each other. A lock has fixed the position relationship between the first portion 40-3 and the second portion 40-4. In this state, inside the innermost-side magnetically-shielded inner-side members 40-3-1, 40-4-1 and with a high magnetic field shielding ratio, it becomes possible to shield the component of the external magnetic field in the direction perpendicular to the central axis of the magnetic field shielding apparatus 40. In the space where the external magnetic field has been shielded with the high magnetic field shielding ratio, it becomes possible to detect, with a high-sensitivity, the z-direction component of the biomagnetic field generated from the examination area.

FIG. 12B illustrates the following state: The first portion 40-3 of the magnetic field shielding apparatus has been displaced in the circumferential direction manually with a handle (not illustrated) fixed to the first portion 40-3, or automatically, and then the position of the first portion 40-3 is locked to form an opening, thereby forming an open space in the angle range of about 90 degrees. As a consequence, in the open space, the doctor 35, in a relaxed posture, can mount the patient 36 onto the bed 20 from a bed-moving base 103, and the patient 36 can lie in the bed 20 in a relaxed manner. The doctor 35 can adjust, with a high-efficiency, the position relationship between the examination area of the patient 36 and the bottom plane of the cryostat 50.

Incidentally, as is the case with the first embodiment, it is needless to say that, with the height of the bottom plane of the cryostat 50 set to be a fixed position, the XYZ-stage of the bed 20 is also usable instead of the XY-stage 21. Moreover, as is the case with the first embodiment, it is needless to say that the configuration where the fourth opening is not provided may be employed.

Fourth Embodiment

The biomagnetic field measuring apparatus in a fourth embodiment of the present invention is a for-bedside biomagnetic field measuring apparatus whose configuration is as follows: The configuration of the biomagnetic field measuring apparatus in the third embodiment is partially modified so that the measuring apparatus is made movable to the proximity to a bed in a hospital room.

A plurality of wheels 100 (not shown in FIG. 10) are located in the magnetic field shielding apparatus/gantry supporting base 30-1 so as to be movable. Also, a plurality of wheels 29-1, 29-2, 29-3, and 29-4 (not illustrated) are located in the bed-and-stage supporting base 22 as well so as to be movable. The data acquisition.process/sensor control apparatus 52, the display apparatus 53, and the coolant supply apparatus or cryocooler 55 are mounted on the truck having the plurality of wheels 100-1.

In the for-bedside biomagnetic field measuring apparatus in the fourth embodiment, with the height of the bottom plane of the cryostat 50 set to be a fixed position, an XYZ-stage 21' of the bed 20 is used instead of-the XY-stage 21.

The following assumption is made: First, as illustrated in FIG. 12C, the for-bed-side biomagnetic field measuring apparatus has been moved to the proximity to the bed-moving base 103 having wheels 29'-1, 29'-2, 29'-3, and 29'-4 (not illustrated) and mounting a bed thereon. After that, as illustrated in FIG. 12B, the above-described state has been established where the first portion 40-3 of the magnetic field shielding apparatus is displaced in the circumferential direction and its position is locked, thereby forming the open space in the angle range of about 90 degrees.

Using the XYZ-stage 21' of the bed 20 in the for-bedside biomagnetic field measuring apparatus, the bed 20-1 on the bed-moving base 103, and the XYZ-stage 21', the position of the bed 20 and that of the bed 20-1 are adjusted in the respective x, y, and z directions. This allows the patient 36 to be easily moved from the bed 20-1 to the bed 20.

Using the bed 20-1 and the XYZ-stage 21', the doctor 35 adjusts the position relationship between the examination area of the patient 36 and the bottom plane of the cryostat 50. After that, in the state illustrated in FIG. 12A, the biomagnetic field from the examination area of the patient 36 is measured. After the biomagnetic field has been measured, the state illustrated in FIG. 12B is established. Then, using the XYZ-stage 21' of the bed 20, the bed 20-1 on the bed-moving base 103, and the XYZ-stage 21', the position of the bed 20 and that of the bed 20-1 are adjusted in the respective x, y, and z directions. This allows the patient 36 to be easily moved from the bed 20 to the bed 20-1.

The for-bedside biomagnetic field measuring apparatus in the fourth embodiment is freely movable, and thus moves inside the hospital, thereby allowing the examination of the inpatient to be executed at the bedside. Accordingly, when measuring an emergency patient or a bedridden patient, the patient need not move to an examination room where the biomagnetic field measuring apparatus has been installed. This reduces the burden imposed on the patient.

Fifth Embodiment

Figure 13:
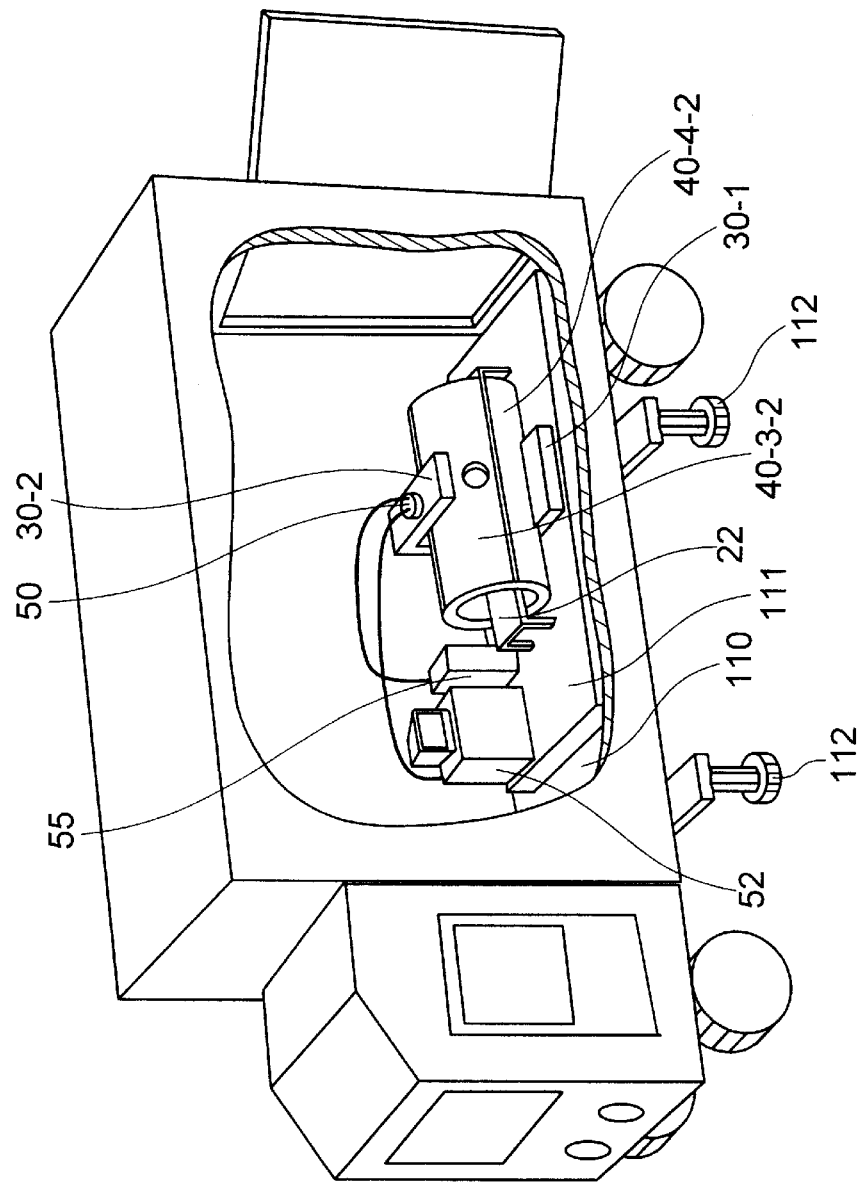
FIG. 13 illustrates a fifth embodiment of the present invention, and is a perspective view for illustrating an example of a medical examination car configured by mounting, on an automobile, the biomagnetic field measuring apparatus explained in the third embodiment or the fourth embodiment, including a partially cut-away portion of the medical examination car.

FIG. 13 illustrates a fifth embodiment of the present invention, and is a perspective view for illustrating an example of a medical examination car (i.e., a mobile-type biomagnetic field measuring apparatus) configured by mounting, on an automobile, the biomagnetic field measuring apparatus explained in the third embodiment or the fourth embodiment, including a partially cut-away portion of the medical examination car. The entire biomagnetic field measuring apparatus is located and fixed onto an anti-vibration stage 111 placed on a floor 110 in the car, thereby shielding the vibrations of the outside. The automobile is equipped with a fixing anchor 112 and, at the time of measuring the biomagnetic field, the anchor 112 is taken down onto the ground so as to fix the automobile onto the ground. This medical examination car moves to local communities such as a school and a health center, then being utilized for a periodic group medical examination or the like.

Sixth Embodiment

Figure 14:
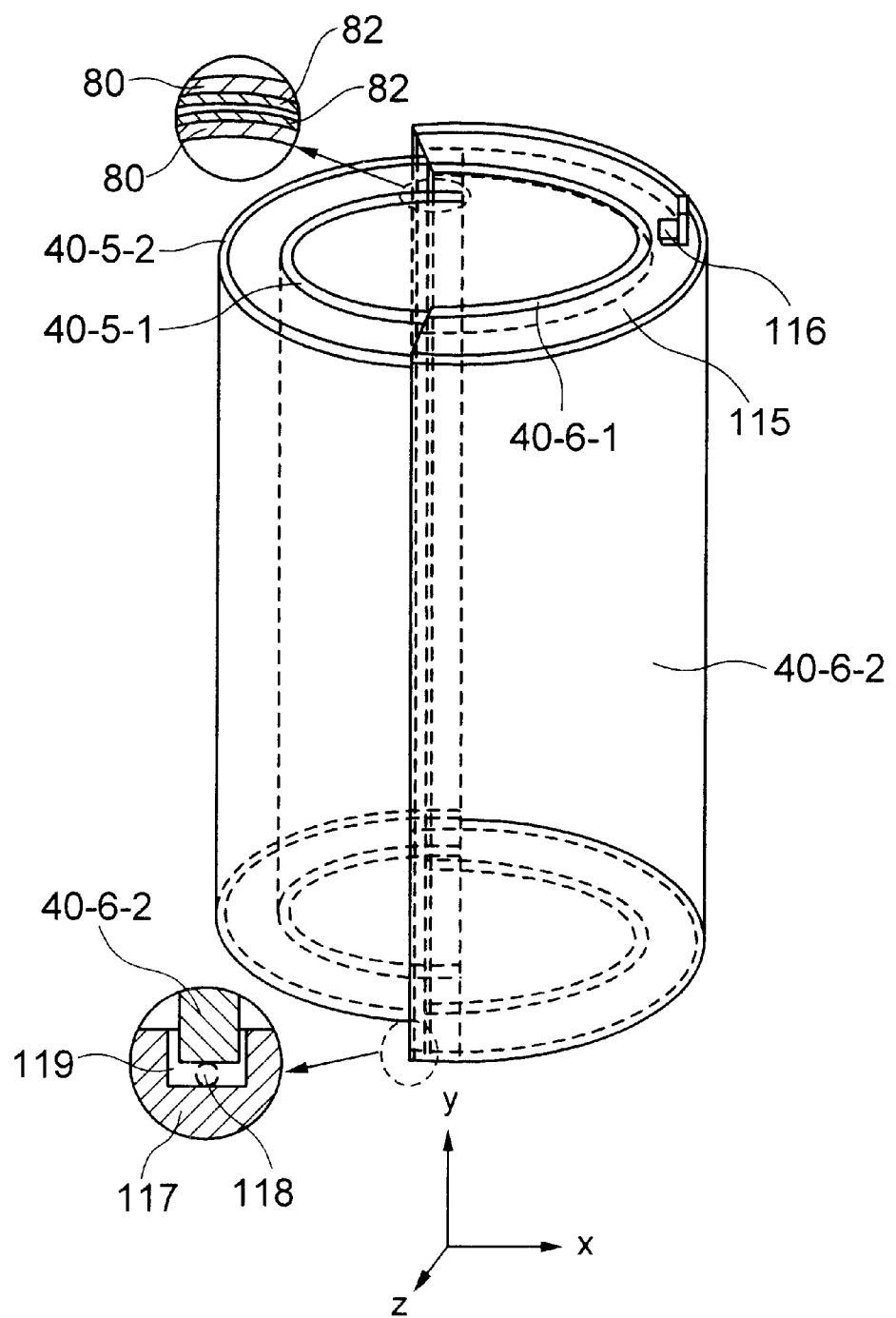
FIG. 14 is a perspective view for illustrating the configuration example of the magnetic field shielding apparatus employed in the biomagnetic field measuring apparatus in a sixth embodiment of the present invention.
Figure 15:
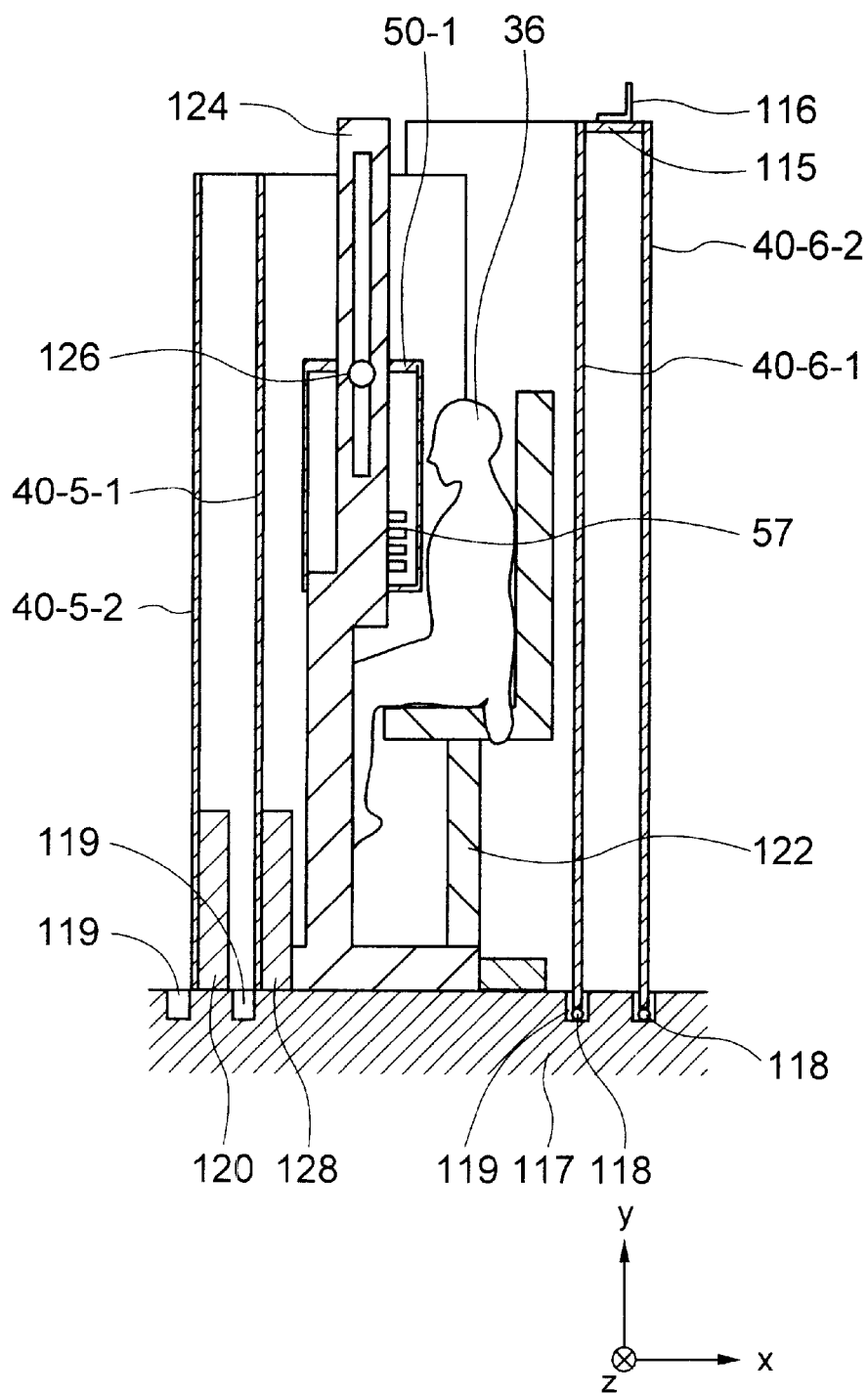
FIG. 15 is a cross-sectional view of the biomagnetic field measuring apparatus employing the magnetic field shielding apparatus illustrated in FIG. 14 in a plane passing through the center of its measuring field-of-view.

FIG. 14 is a perspective view for illustrating the configuration example of the magnetic field shielding apparatus employed in the biomagnetic field measuring apparatus in a sixth embodiment of the present invention, including a partially enlarged cross-section of the shielding apparatus. FIG. 15 is a cross-sectional view of the biomagnetic field measuring apparatus employing the magnetic field shielding apparatus illustrated in FIG. 14 in a plane passing through the center of its measuring field-of-view.

The magnetic field shielding apparatus 40 explained in the first embodiment is divided into 2 portions in the circumferential direction, thereby being configured by a first portion 40-5 of the magnetic field shielding apparatus and a second portion 40-6 thereof. The first portion and the second portion configure the magnetic field shielding apparatus illustrated in FIG. 14. The first portion 40-5 of the magnetic field shielding apparatus is configured to be displaceable in the circumferential direction with reference to the second portion 40-6 thereof.

A plurality of wheels 118 are fixed to lower-portions of a first magnetically-shielded inner-side member for inner cylinder 40-6-1 and a second magnetically-shielded outer-side member for outer cylinder 40-6-2. As illustrated in the enlarged cross-section in FIG. 14, the wheels 118 are located inside a displacement guide groove 119 formed in a floor 117. Upper-portions of the second magnetically-shielded inner-side member for inner cylinder 40-6-1 and the second magnetically-shielded outer-side member for outer cylinder 40-6-2 are connected by a connecting plate 115. An upper-portion connecting unit 116 for implementing the displacement and for connecting the upper-portions to a circle-shaped guide rail located on a ceiling is fixed to the connecting plate 115.

As illustrated in the enlarged cross-section in FIG. 14, the high-permeability sheet layer 82 is formed by the high-permeability sheets 23 in the inner-sides of the respective high-permeability sheet supporting cylinders 80 of the second magnetically-shielded inner-side member for inner cylinder 40-6-1 and the second magnetically-shielded outer-side member for outer cylinder 40-6-2. The high-permeability sheet layer 82 is formed by the high-permeability sheets 23 in the outer-sides of the respective high-permeability sheet supporting cylinders 80 of a first magnetically-shielded inner-side member for inner cylinder 40-5-1 and a second magnetically-shielded outer-side member for outside cylinder 40-5-2. As a result, a configuration is employed where, in the overlapped portion, the high-permeability sheet layers 82 are caused to be in close proximity to each other. This configuration decreases a leaking magnetic-flux, thereby enhancing the magnetic field shielding factor.

As illustrated in FIG. 15, the first magnetically-shielded inner-side cylinder 40-5-1 and the second magnetically-shielded outer-side cylinder 40-5-2 are fixed to the floor 117 by a magnetically-shielded cylinder supporter 128 and a magnetically-shielded cylinder supporter 120, respectively. The plane of a cryostat 50-1 on the side where the SQUID magnetic-flux meters 57 are arranged 2-dimentionally is fixed to a gantry 124 in a displaceable manner. After the adjustment of the position relationship between the examination area of the patient 36 who sits on a chair 122 displaceable. in the respective x, y directions and the plane of the cryostat 50-1 on the side where the SQUID magnetic-flux meters 57 are arranged, and the adjustment of the height position of the cryostat 50-1, a cryostat-position fixing lock 126 fixes the cryostat 50-1.

The height of the second portion 40-6 of the magnetic field shielding apparatus is made higher than that of the first portion 40-5 thereof, thereby simplifying the structure for rotating the second portion 40-6 thereof. The following configuration is employed: The second portion 40-6 thereof has a circumferential-portion of about 200 degrees, and the first portion 40-5 thereof has a circumferential portion of about 180 degrees. Moreover, the first portion and the second portion are overlapped with each other at both of the edge portions and in the range of about 10 degrees, respectively. Namely, when overlapped with each other at both of the edge portions parallel to the central axis of the magnetic field shielding apparatus and in the range of about 10 degrees, the first magnetically-shielded inner-side member for inner cylinder 40-5-1 and the first magnetically-shielded inner-side cylinder 40-6-1, and the second magnetically-shielded outer-side member for outer cylinder 40-5-2 and the second magnetically-shielded outer-side member for outer cylinder 40-6-2 form the magnetic field shielding apparatus existing in a closed state, respectively. Meanwhile, when overlapped in the range of about 180 degrees, they each form the magnetic field shielding apparatus existing in an opened state.

The overlapped portion is made large enough in the closed state, thereby enhancing the magnetic field shielding factor. As a result of this, inside the innermost-side magnetically-shielded inner-side members 40-5-1, 40-6-1 and with a high-magnetic field shielding ratio, it becomes possible to shield the component of the external magnetic field in the direction perpendicular to the central axis of the magnetic field shielding apparatus 40. In the space where the external magnetic field has been shielded with the high magnetic field shielding ratio, it becomes possible to detect, with a high-sensitivity, an x-direction component of the biomagnetic field generated from the examination area.

The second portion 40-6 of the magnetic field shielding apparatus is rotated, thereby forming an open space. Then, in the state where the patient 36 sits on the chair 122, the doctor 35 adjusts the position relationship between the examination area of the patient 36 and the outer-plane of the cryostat 50-1.

The central axes of the respective magnetically-shielded cylinders 60 included in the magnetic field shielding apparatus employed in the sixth embodiment are located coaxially, and the respective magnetically-shielded cylinders are divided at the planes parallel to the central axes. The respective magnetically-shielded cylinders are located vertically. In the magnetic field shielding apparatus employed in the sixth embodiment, the patient 36 can easily enter the inside of the magnetic field shielding apparatus. This makes it possible to implement the position alignment of the examination area with a high-efficiency. The magnetic field shielding apparatus employed in the sixth embodiment is a small-sized one, and accordingly just a small area suffices for the setting of the biomagnetic field measuring apparatus.

Additionally, it is needless to say the following: With the height of the cryostat 50-1 set to be a fixed position and, instead of the XY-stage, with the use of the XYZ-stage for controlling the x, y, and z direction-displacement of the chair 122 which the examination-target 36 sits on, it is possible to execute the position alignment between the plane of the cryostat 50-1 on the side where the SQUID magnetic-flux meters 57 are arranged and the plane of the examination area of the examination-target 36.

Seventh Embodiment

Figure 16:
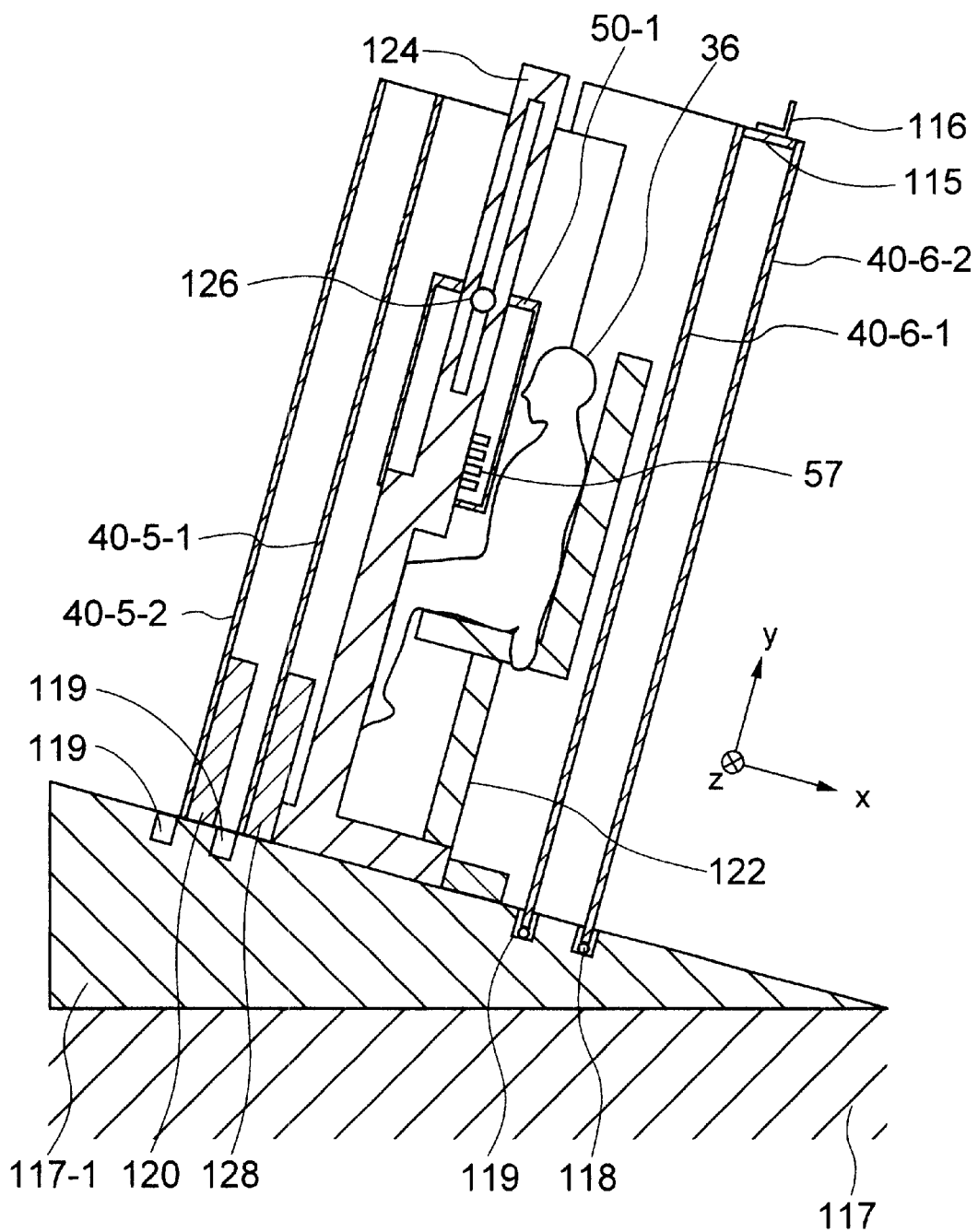
FIG. 16 illustrates a seventh embodiment of the present invention, and is a cross-sectional view of the biomagnetic field measuring apparatus employing the magnetic field shielding apparatus illustrated in FIG. 14 in a plane passing through the center of its measuring field-of-view.

FIG. 16 illustrates a seventh embodiment of the present invention, and is a cross-sectional view of the biomagnetic field measuring apparatus employing the magnetic field shielding apparatus illustrated in FIGS. 14 and 15 in a plane passing through the center of its measuring field-of-view. In the biomagnetic field measuring apparatus in the seventh embodiment, the magnetic field shielding apparatus illustrated in FIGS. 14 and 15 is located on a floor 117-1 that is inclined at an angle falling in the range of 20 to 30 degrees with reference to the floor 117. The other configurations are the same as those in the sixth embodiment.

Eighth Embodiment

Figure 17:
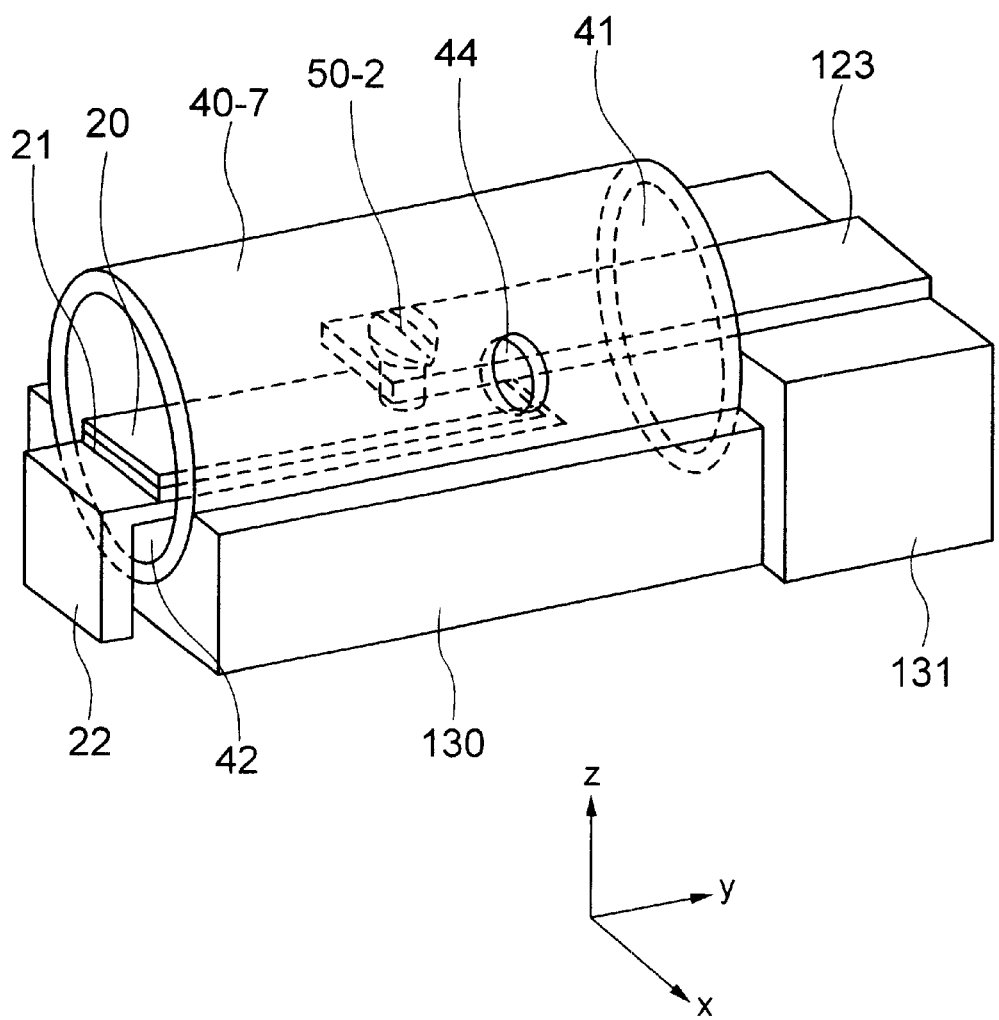
FIG. 17 is a perspective view for illustrating the configuration example of the biomagnetic field measuring apparatus in an eighth embodiment of the present invention.
Figure 18:
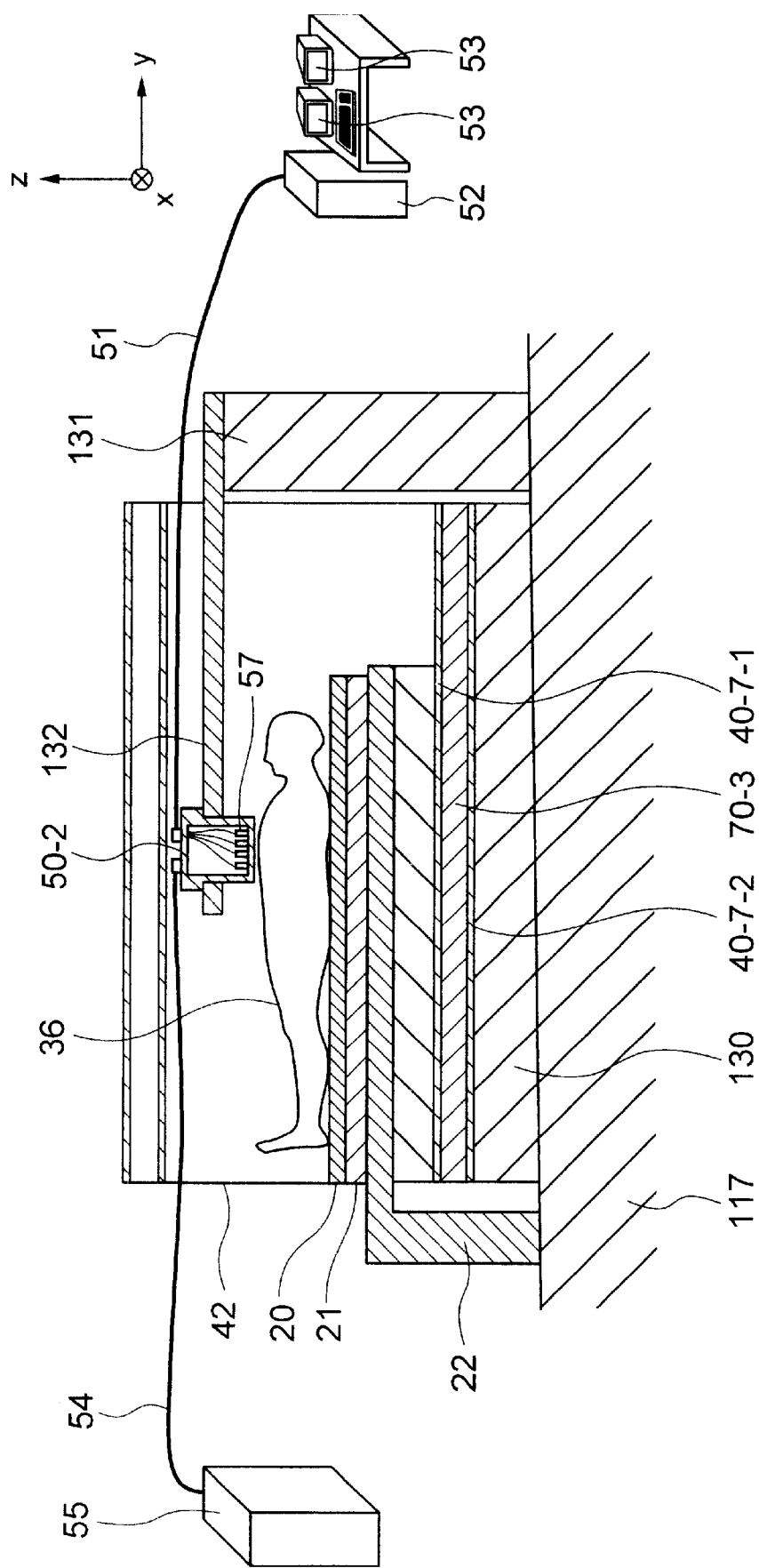
FIG. 18 is a cross-sectional view of the biomagnetic field measuring apparatus illustrated in FIG. 17 in a plane passing through the center of its measuring field-of-view.

FIG. 17 is a perspective view for illustrating the configuration example of the biomagnetic field measuring apparatus in an eighth embodiment of the present invention. FIG. 18 is a cross-sectional view of the biomagnetic field measuring apparatus illustrated in FIG. 17 in a plane passing through the center of its measuring field-of-view.

Hereinafter, the explanation will be given mainly concerning the points differing from those in the first embodiment. A magnetic field shielding apparatus 40-7 includes a magnetically-shielded inner-side cylinder 40-7-1 and a magnetically-shielded outer-side cylinder 40-7-2. The magnetic field shielding apparatus 40-7 is supported by a magnetic-field-shielding-apparatus supporter 130 fixed to the floor 117.

The eighth embodiment employs planar-type SQUID magnetic-flux meters where the detection coils for detecting a magnetic field are formed using thin films, thereby making it possible to employ a small-sized cryostat. In the eighth embodiment, in the configuration of the magnetic field shielding apparatus 40 explained in the first embodiment, the third opening 43 for inserting the cryostat 50 is not formed. Instead, a cryostat 50-2 in the bottom portion of which the SQUID magnetic-flux meters are arranged in a 2-dimentional manner is located inside the magnetically-shielded inner-side cylinder 40-7-1. The cryostat 50-2 is supported by a cryostat supporting plate 132. The cryostat supporting plate 132 is supported by a fixing base 131, which supports the cryostat supporting plate and is fixed to the floor 117.

The bed-and-stage supporting base 22 on which the bed 20 and the XY-stage 21 are mounted is located inside the magnetically-shielded inner-side cylinder 40-7-1 through a spacer 140-2. It is needless to say that, although the lower half is filled with a filling agent 70-3 in an example illustrated in FIG. 18, the area of the upper half may be filled with the filling agent further.

In the eighth embodiment, the third opening 43 explained in the first embodiment is not formed. As a result of this, inside the innermost-side magnetically-shielded cylinder 40-7-1 and with a magnetic field shielding ratio which is higher than that of the magnetic field shielding apparatus illustrated in the first embodiment, it becomes possible to shield the component of the external magnetic field in the direction perpendicular to the central axis of the magnetic field shielding apparatus 40. In the space where the external magnetic field has been shielded with the higher magnetic field shielding ratio, it becomes possible to detect, with a high-sensitivity, the z-direction component of the biomagnetic field generated from the examination area.

The patient mounted on the bed 20 is inserted from the second opening 42 into the inside of the magnetically-shielded inner-side cylinder 40-7-1 in the following way: Namely, more desirably, the foot portion is caused to pass through the lower portion of the cryostat 50-2 first, and after that, the chest portion is caused to reach the lower portion of the cryostat so that a sense of oppression is reduced down to the smallest-possible degree. Of course, as illustrated in FIG. 18, it is allowable to transfer the patient into the inside of the magnetically-shielded inner-side cylinder 40-7-1 with the head portion passing through first. Then, the doctor adjusts the position relationship between the examination area of the patient 36 and the bottom plane of the cryostat 50-2, using the XY-stage 21 of the bed 20 and a height-direction displacing apparatus (i.e., a position adjusting apparatus) integrated into the fixing base 131 of the cryostat supporting plate. After that, the doctor measures the biomagnetic field generated from the examination area.

As is the case with the first embodiment, it is needless to say that, with the height of the cryostat 50-2 set to be a fixed position, the XYZ-stage of the bed 20 is also usable instead of the XY-stage 21. Moreover, as is the case with the first embodiment, it is needless to say that the configuration where the fourth opening is not provided may be employed.

Ninth Embodiment

Figure 19:
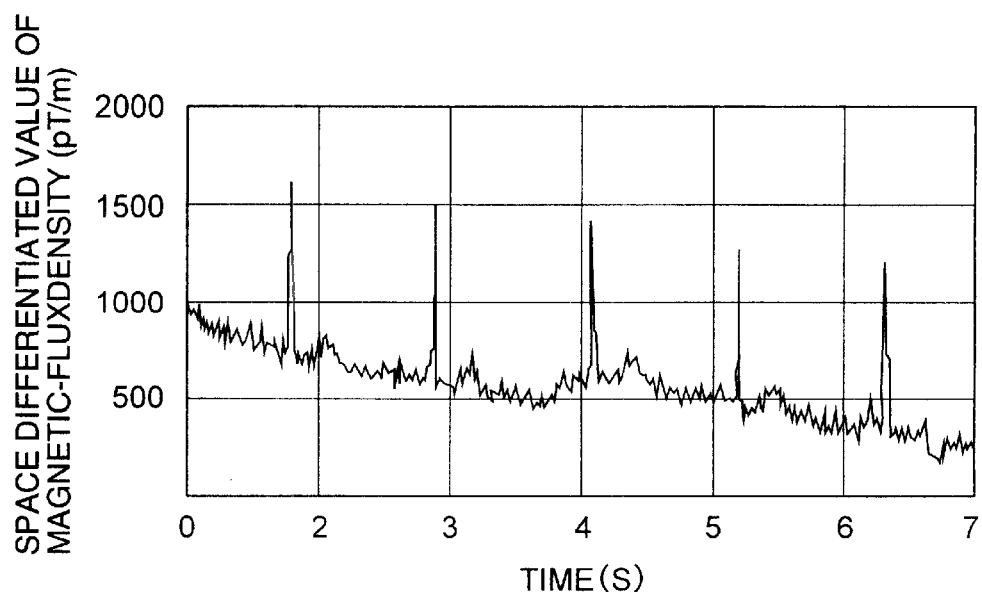
FIG. 19 is a diagram for illustrating an example of the magnetic field waveform measured by the biomagnetic field measuring apparatus illustrated in the first embodiment of the present invention.

FIG. 19 is a diagram for illustrating an example of the magnetic field waveform measured by the biomagnetic field measuring apparatus illustrated in the first embodiment of the present invention. FIG. 19 indicates a magnetic field generated from the heart of a normal subject and detected using 4-channel in-total SQUID magnetic-flux meters located at the respective vertex points of a square in the bottom portion inside a cryostat. The magnetic field waveform that FIG. 19 indicates is a 1-channel magnetic field waveform. The transverse axis in FIG. 19 indicates the time (sec), and the longitudinal axis indicates the space-differentiated value (pT/m) of the detected magnetic-flux density.

The configuration of the magnetic field shielding apparatus 40 used when obtaining the measurement result in the eighth embodiment is as follows: The magnetic field shielding apparatus used includes a first, a second, and a third magnetically-shielded cylinders 60 located coaxially from the inner-side to the outer-side. In addition, the high-permeability sheet layer 82 is formed by the high-permeability sheets 23 in the outer-sides of the high-permeability sheet supporting cylinders 80. In the magnetic field shielding apparatus used, the fourth opening has been not provided. The third opening has been formed into a 30-cm radius circle-shaped opening in order that the circle-shaped cross-section cryostat where the 4-channel SQUID magnetic-flux meters are located can be inserted therein.

As the first, the second, and the third magnetically-shielded cylinders, 0.5 mm-thick and 200 cm-long aluminum-composed hollow cylinders having 80-cm, 90-cm; and 100-cm inner-radiuses have been employed, respectively. The third opening has been formed in the central portion of each hollow cylinder in the length direction.

A commercially available product (HITACHI METAL LTD., the trade name: FINEMET®) has been used as the high-permeability sheets 23 used. As the high-permeability material of the high-permeability sheets 23, a soft-magnetic amorphous alloy is employed. Here, the soft-magnetic amorphous alloy has a nanocrystalline structure the crystalline grain size of which is equal to 100 n m or less, and is an Fe—Cu—Nb—Si—B-based (Fe: 73.5%, Cu: 1%, Nb: 3%, Si: 13.5%, B: 9%) alloy the maximum relative-permeability of which is equal to 50000 or more.

The configuration of the used high-permeability sheets 23 is that the magnetic-material ribbons (the high-permeability material) 25 are about 20 $\mu$m thick, the base sheets 26-1, 26-2 are about 30 $\mu$m thick, and the high-permeability sheet 23 is 100 $\mu$m in total thickness. The 610-cm by 240-cm area high-permeability sheets 23 have been pasted in a state of being overlapped on the outer circumferential surface of each aluminum-composed hollow cylinder, thereby forming the high-permeability sheet layer 82 about 1 mm thick.

As illustrated in FIG. 2, each flexible high-permeability sheet 23 has been pasted on the circumferential surface of each hollow cylinder with the use of an adhesive agent so that the short side of each magnetic-material ribbon 25 becomes substantially parallel to the central axis of each hollow cylinder, and so that the long side of each magnetic-material ribbon 25 surrounds the central axis of each hollow cylinder inwardly and the long side becomes substantially parallel to a plane perpendicular to the central axis of each hollow cylinder. In this way, the plurality of layers of the high-permeability sheets 23 have been formed.

The employment of the simply-configured magnetic field shielding apparatus has allowed the component of the external magnetic field in the direction perpendicular to the central axis of the magnetic field shielding apparatus (i.e., the central axis of the first, the second, and the third magnetically-shielded cylinders) to be attenuated down to −35 dB at the position of the central axis of the innermost-side first magnetically-shielded cylinder. Namely, it becomes possible to attenuate the component of the external magnetic field in the direction perpendicular to the central axis of the magnetic field shielding apparatus down to −35 dB at the position of the central axis of the innermost-side first magnetically-shielded cylinder. As a consequence, the SQUID magnetic-flux meters are capable of detecting, with a high-sensitivity, the z-direction component of the biomagnetic field generated from the examination area of the living body placed inside the magnetic field shielding apparatus.

The magnetic field shielding ratio of the employed magnetic field shielding apparatus has proved to be 1/56 at the position of the central axis of the magnetic field shielding apparatus. Thus, it has been found that the magnetic field generated from the heart of an adult normal subject can be measured with a 10 or more signal-to-noise ratio at the appearing point-in-time of an R-wave.

Incidentally, in the case where each magnetically-shielded cylinder has been formed through the formation of the plurality of layers of the high-permeability sheets 23 by pasting each high-permeability sheet 23 on the circumferential surface of each hollow cylinder so that the long side of each magnetic-material ribbon 25 becomes substantially parallel to the central axis of each hollow cylinder, it has become possible to attenuate the component of the external magnetic field in the direction perpendicular to the central axis of the magnetic field shielding apparatus down to about −31 dB at the position of the central axis of the innermost-side first magnetically-shielded cylinder.

In the above-explained configurations of the first, the second, the third, the fourth, the fifth, and the eighth embodiments, in the case where the fourth opening is provided, it is possible to set the fourth opening to be about 30 cm in diameter when the innermost-side magnetically-shielded cylinder is equal to about 1 m in inner-diameter.

Also, in the configurations of the first, the second, and the eighth embodiments, the transfer of the examination-target (i.e., the patient) into the inside-space of the innermost-side magnetically-shielded cylinder of the magnetic field shielding apparatus is executed in the-following way: Namely, the foot portion is caused to pass through the lower portion of the cryostat first and, finally, the chest portion is caused to reach the lower portion of the cryostat so that a sense of oppression is reduced down to the smallest possible degree.

The apparatus of the present invention has the following features (18)–(20).

(18) A magnetic field measuring apparatus, comprising:
a magnetic field shielding apparatus including a plurality of non-magnetic cylindrical members on which a plurality of high-permeability sheets having a high-permeability are located in a state of being partially overlapped with each other, said cylindrical members being located in such a manner as to surround an axis of a first direction concentrically and having a hollow portion, said cylindrical member located on an innermost-side having a first opening at one end of said first direction, a second opening at the other end of said first direction, and a third opening penetrating said plurality of cylindrical members in a direction perpendicular to said axis of said first direction, a component of an external magnetic field in said direction perpendicular to said first direction being shielded in an inner-side space of said cylindrical member located on said innermost-side, and a cryostat whose bottom plane is located in said inner-side space for maintaining a plurality of SQUID magnetic-flux meters at a low-temperature.

(19) A magnetic field measuring apparatus, comprising:
a magnetic field shielding apparatus including a plurality of non-magnetic cylindrical members on which a plurality of high-permeability sheets having a high-permeability are located in a state of being partially overlapped with each other, said cylindrical members being located in such a manner as to surround an axis of a first direction concentrically and having a hollow portion, said cylindrical member located on an innermost-side having a first opening at one end of said first direction and a second opening at the other end of said first direction, a component of an external magnetic field in said direction perpendicular to said first direction being shielded in an inner-side space of said cylindrical member located on said innermost-side, and a cryostat whose bottom plane is located in said inner-side space for maintaining a plurality of SQUID magnetic-flux meters at a low-temperature, wherein, on said each high-permeability sheet, regions of a magnetic material having a high-permeability are formed into a rectangle-shaped configuration in a state of being sandwiched between non-magnetic base sheets, said plurality of respective rectangles overlapping with each other at long sides of said rectangles adjacent thereto, said long sides of said plurality of rectangles being arranged in substantially parallel to each other, short sides of said plurality of rectangles on said each high-permeability sheet being located in substantially parallel to said axis of said first direction, said high-permeability sheets being held on a surface of each of said plurality of cylindrical members in such a manner that said long sides of said plurality of rectangles on said each high-permeability sheet surround said axis of said first direction inwardly.

(20) A magnetic field measuring apparatus, comprising:
a magnetic field shielding apparatus including a plurality of non-magnetic cylindrical members on which a plurality of high-permeability sheets having a high-permeability are located in a state of being partially overlapped with each other, said cylindrical members being located in such a manner as to surround an axis of a first direction concentrically and having a hollow portion, said cylindrical member located on an innermost-side having a first opening at one end of said first direction and a second opening at the other end of said first direction, a component of an external magnetic field in said direction perpendicular to said first direction being shielded in an inner-side space of said cylindrical member located on said innermost-side, living-body holder located in said inner-side space for holding a living body, and a cryostat whose bottom plane is located in said inner-side space for maintaining a plurality of SQUID magnetic-flux meters at a low-temperature, wherein, on said each high-permeability sheet, regions of a magnetic material having a high-permeability are formed into a rectangle-shaped configuration in a state of being sandwiched between non-magnetic base sheets, said plurality of respective rectangles overlapping with each other at long sides of said rectangles adjacent thereto, said long sides of said plurality of rectangles being arranged in substantially parallel to each other, short sides of said plurality of rectangles on said each high-permeability sheet being located in substantially parallel to said axis of said first direction, said high-permeability sheets being held on a surface of each of said plurality of cylindrical members in such a manner that said long sides of said plurality of rectangles on said each high-permeability sheet surround said axis of said first direction inwardly, said plurality of SQUID magnetic-flux meters detecting a component of a magnetic field in said direction perpendicular to said first direction, said magnetic field being generated from said living body.

What is claimed is:

1. A magnetic field measuring apparatus, comprising:
a magnetic field shielding apparatus including a plurality of non-magnetic cylindrical members on which a plurality of high-permeability sheets having a high-permeability are located in a state of being partially overlapped with each other, said cylindrical members being located in such a manner as to surround an axis of a first direction concentrically and having a hollow portion, said cylindrical member located on an innermost-side having a first opening at one end of said first direction, a second opening at the other end of said first direction, and a third opening penetrating said plurality of cylindrical members in a direction perpendicular to said axis of said first direction, a component of an external magnetic field in said direction perpendicular to said first direction being shielded in an inner-side space of said cylindrical member located on said innermost-side,
a living-body holder located in said inner-side space for holding a living body in such a manner as to make a body-axis direction substantially parallel to said axis of said first direction, and
a cryostat which is inserted into said third opening and whose bottom plane is located in said inner-side space for maintaining a plurality of SQUID magnetic-flux meters at a low-temperature, wherein said plurality of SQUID magnetic-flux meters detect a component of a magnetic field in said direction perpendicular to said first direction, said magnetic field being generated from said living body.

2. The magnetic field measuring apparatus as claimed in claim 1, wherein configuration of cross-sections of said plurality of cylindrical members perpendicular to said axis of said first direction is of a circle.

3. The magnetic field measuring apparatus as claimed in claim 1, wherein the number of said cylindrical members falls in a range of 2 to 5.

4. The magnetic field measuring apparatus as claimed in claim 1, wherein configuration of a cross-section of said cylindrical member perpendicular to said axis of said first direction is of a circle, said cylindrical member being located on said innermost-side, said circle falling in a range of 50 cm to 200 cm in diameter.

5. The magnetic field measuring apparatus as claimed in claim 1, wherein said bottom plane of said cryostat is located in said inner-side space in such a manner as to be opposed to a chest plane of said living body or a back plane thereof.

6. The magnetic field measuring apparatus as claimed in claim 1, wherein said third opening is opposed to a chest plane of said living body or a back plane thereof.

7. The magnetic field measuring apparatus as claimed in claim 1, wherein said each cylindrical member is configured to be partially displaceable, said third opening being formed by said partial displacement of said each cylindrical member.

8. The magnetic field measuring apparatus as claimed in claim 1, wherein said each cylindrical member is partially displaceable in any direction of said first direction, a circumferential direction surrounding said axis of said first direction, and a direction intersecting with said first direction, said third opening being formed by said partial displacement of said each cylindrical member.

9. The magnetic field measuring apparatus as claimed in claim 1, wherein said magnetic field shielding apparatus has a fourth opening penetrating said each cylindrical member in said direction perpendicular to said axis of said first direction, said fourth opening existing within a field-of-view of said living body.

10. The magnetic field measuring apparatus as claimed in claim 1, wherein there is provided a position adjusting apparatus for adjusting a position relationship between said bottom plane of said cryostat and a surface of said living body.

11. The magnetic field measuring apparatus as claimed in claim 1, wherein there is provided a position adjusting apparatus for adjusting a position relationship between said bottom plane of said cryostat and a surface of said living body, said position adjusting apparatus adjusting said position relationship in said direction perpendicular to said first direction.

12. The magnetic field measuring apparatus as claimed in claim 1, wherein, on said each high-permeability sheet, regions of a magnetic material having a high-permeability are formed into a rectangle-shaped configuration in a state of being sandwiched between non-magnetic base sheets, said plurality of respective rectangles overlapping with each other at long sides of said rectangles adjacent thereto, said long sides of said plurality of rectangles being arranged in substantially parallel to each other (said high-permeability sheets are formed into a rectangle-shaped configuration by sandwiching a magnetic material having a high-permeability between non-magnetic base sheets).

13. The magnetic field measuring apparatus as claimed in claim 1, wherein, on said each high-permeability sheet, regions of a magnetic material having a high-permeability are formed into a rectangle-shaped configuration in a state of being sandwiched between non-magnetic base sheets, said plurality of respective rectangles overlapping with each other at long sides of said rectangles adjacent thereto, said long sides of said plurality of rectangles being arranged in substantially parallel to each other, short sides of said plurality of rectangles on said each high-permeability sheet being located in substantially parallel to said axis of said first direction, said high-permeability sheets being held on a surface of each of said plurality of cylindrical members in such a manner that said long sides of said plurality of rectangles on said each high-permeability sheet surround said axis of said first direction inwardly.

14. The magnetic field measuring apparatus as claimed in claim 1, wherein said axis of said first direction is substantially horizontal to a floor surface.

15. The magnetic field measuring apparatus as claimed in claim 1, wherein said axis of said first direction is substantially vertical to a floor surface.

16. The magnetic field measuring apparatus as claimed in claim 1, wherein said axis of said first direction is inclined at an angle falling in a range of 20 degrees to 30 degrees to a horizontal plane.

17. The magnetic field measuring apparatus as claimed in claim 1, wherein a diameter of said third opening is smaller than that of said bottom plane of said cryostat.

* * * * *